United States Patent
Bilic et al.

(10) Patent No.: US 10,620,256 B2
(45) Date of Patent: *Apr. 14, 2020

(54) DIRECT CURRENT METER EMPLOYING WAVEFORM SEPARATOR FOR DETECTING LEAKAGE CURRENT

(71) Applicant: Quanta Associates, L.P., Houston, TX (US)

(72) Inventors: Zoran Bilic, Winnipeg (CA); David James Ball, Houston, TX (US); Donald William McLennan, Langley (CA)

(73) Assignee: Quanta Associates, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/993,961

(22) Filed: May 31, 2018

(65) Prior Publication Data

US 2018/0313885 A1 Nov. 1, 2018

Related U.S. Application Data

(63) Continuation-in-part of application No. 15/173,072, filed on Jun. 3, 2016, now Pat. No. 10,254,316, and a continuation-in-part of application No. 15/829,655, filed on Dec. 1, 2017.

(Continued)

(51) Int. Cl.
*G01R 31/02* (2006.01)
*G01R 19/00* (2006.01)
(Continued)

(52) U.S. Cl.
CPC ....... *G01R 31/025* (2013.01); *G01R 31/1245* (2013.01); *H01B 17/56* (2013.01); *H03K 5/24* (2013.01)

(58) Field of Classification Search
CPC ............... G01R 31/025; G01R 31/085; G01R 31/1245; G01R 19/0015; G01R 19/0092;
(Continued)

(56) References Cited

U.S. PATENT DOCUMENTS

| | | |
|---|---|---|
| 2,319,587 A | 5/1943 | Conard |
| 2,997,529 A | 8/1961 | Fink |

(Continued)

FOREIGN PATENT DOCUMENTS

GB 1492444 A 11/1977

OTHER PUBLICATIONS

Dick Milton, "High Voltage Live Line Working", Jan. 1, 2013, 14 pages, UK Power Networks, Manchester, United Kingdom.

(Continued)

*Primary Examiner* — Minh N Tang
(74) *Attorney, Agent, or Firm* — Oath Law Firm; Mark A. Oathout; Anthony C. Edwards

(57) ABSTRACT

A system for determining DC leakage current flowing through an electrically insulating structure in a high voltage direct current power system is provided. The DC leakage current is a composite DC current. The insulating structure is operatively coupled to at least an overhead energized DC electrical line. The system further includes a direct current meter adapted to be electrically coupled to at least the insulating structure. The meter includes a waveform separator. The separator is configured to receive and separate the composite DC current into a corresponding direct current (DC) and an alternating current (AC) component. The separator further includes at least one comparator which is configured to produce at least one corresponding digital signal from the AC component; and a processor. The processor receives and analyzes the at least one corresponding digital signal and the DC component to determine a resultant leakage current flowing through the insulating structure.

21 Claims, 16 Drawing Sheets

Related U.S. Application Data

(60) Provisional application No. 62/170,554, filed on Jun. 3, 2015, provisional application No. 62/429,459, filed on Dec. 2, 2016.

(51) Int. Cl.
  *H01B 17/56* (2006.01)
  *H03K 5/24* (2006.01)
  *G01R 31/12* (2020.01)

(58) Field of Classification Search
  CPC ... G01R 19/2513; G08B 21/02; G08B 21/185
  See application file for complete search history.

(56) References Cited

U.S. PATENT DOCUMENTS

| | | | |
|---|---|---|---|
| 3,346,236 A | 10/1967 | Hubbard et al. | |
| 3,514,695 A | 5/1970 | Skarshaug | |
| 3,688,017 A | 8/1972 | Roots | |
| 4,833,415 A * | 5/1989 | Nourai | G01R 31/025 324/551 |
| 9,535,105 B2 * | 1/2017 | Phillips | G01R 31/1245 |
| 9,817,038 B2 * | 11/2017 | Davis | G01R 15/142 |
| 2005/0081458 A1 * | 4/2005 | McDonald | H02G 7/02 52/98 |
| 2013/0169286 A1 * | 7/2013 | Phillips | G01R 31/02 324/509 |

OTHER PUBLICATIONS

Guillaume Heroin et al., "Live Working, a Cutting-Edge Technique, 50 Years of French History", Apr. 1, 2014, 122 pages, RTE, Paris, France.

Jedlicska, Istvan, Extended European Search Report for EP Application No. 16 80 4556, dated Jan. 15, 2019, 12 pages, European Patent Office, Munich, Germany.

* cited by examiner

DIRECT CURRENT METER EMPLOYING WAVEFORM SEPARATOR FOR DETECTING LEAKAGE CURRENT

CROSS REFERENCE TO RELATED APPLICATIONS

This application is a Continuation In Part of U.S. patent application Ser. No. 15/173,072 (U.S. Pat. No. 10,254,316) filed Jun. 3, 2016, which in turn claims priority from U.S. Provisional Patent Application No. 62/170,554 filed Jun. 3, 2015, both entitled "Direct Current Meter and Method of Use". This application is also a Continuation In Part of U.S. patent application Ser. No. 15/829,655 filed Dec. 1, 2017, which in turn claims priority from U.S. Provisional Patent Application 62/429,459 filed Dec. 2, 2016, both entitled "Waveform Separator Apparatus and Method for Detecting Leakage Current In High Voltage Direct Current Power Systems". Entireties of all the applications referred to in this paragraph are incorporated herein by reference.

FIELD OF THE INVENTION

This invention relates to a Direct Current (DC) meter and method of use on energized DC electrical transmission and distribution power lines. In particular embodiments described herein relate to an apparatus and method for measuring leakage current and, more particularly, to an apparatus and method for measuring leakage current flowing through insulating structures in high voltage direct current power systems.

BACKGROUND OF THE INVENTION

This section provides background information related to the present disclosure which is not necessarily prior art. Certain barehand or common potential methods of servicing live, or energized, alternating current (AC) power lines are generally known to specially-trained or skilled individuals within the electrical construction and maintenance industry. Generally, barehand and common potential maintenance methods permit maintenance on power lines to be more efficient because electrical power does not need to be shut off to, or routed around, the power line for which maintenance is to be performed. In one instance of performing maintenance on a high voltage AC power line, an aerial lift platform, such as a bucket truck, may be equipped with an insulated, extendable boom to insulate workers in the bucket from ground potential and thus any potential difference with a high voltage AC power line, with which the workers may be in common potential. In conjunction with barehand and common potential methods used on AC power lines, an AC meter may be used to monitor current that passes through the insulated, extendable boom. While using such a meter and method on an AC power line has proven satisfactory, because Direct Current (DC) high voltage and associated current behaves much differently, and an AC meter and techniques are not satisfactory for work on a DC high voltage power line, a new DC meter and method of using the DC meter are desired.

Electrical power systems comprise several insulating structures, for example outdoor insulators. Energized lines are supported from support structures such as poles or towers by means of outdoor insulators. Such insulators are made of dielectric material such as porcelain, glass or other suitable material. These insulators tend to deteriorate over a period of time. One of the main causes for insulator deterioration is dielectric contamination. Outdoor insulators are continuously exposed to the environment and contaminants such as salt, dust, sand and other industrial pollutants tend to deposit or build-up on the insulator surface as a dry layer. The dry contaminant layer becomes conductive under light wetting conditions such as light rain or morning dew thereby reducing the dielectric performance of the insulator. Since one end of the insulator is energized, and the other end is grounded, reduced dielectric performance results in current flowing through the insulator to the ground. This current is typically referred to as leakage current. When the contamination is severe, leakage current can reach unacceptably high levels. When the leakage current exceeds a highest permissible value for a particular voltage class, it may result in a condition referred to as flashover. Flashovers create high temperature electrical arcs which may endanger line personnel, cause power outages and damage equipment.

Measurement and analysis of leakage current flowing through an outdoor insulator may be used to determine insulator degradation and consequently predict a flashover condition. Typically, a peak or RMS value of the leakage current is determined. This value is then correlated with flashover voltages to predict flashover. In an attempt to prevent flashover, leakage current flowing through insulators is periodically measured and analyzed.

Other predominant insulating structures in an electrical power system include an aerial boom or other support structures such as scaffolding, ladders or lattice towers. These structures enable workers to reach the overhead energized lines for conducting barehand work on the energized lines. Such structures include electrically insulating sections, which ensure that there is no electrical path from the energized lines to ground. The insulating structures allow a worker to work directly on the energized lines. If the electrical resistance of such insulating structures breaks down due to factors stated above, a worker could experience electric shock and injury.

There are several methods for detecting flow of leakage current through such insulating structures. Some known methodologies involve de-energizing the transmission line prior to testing. The methodologies discussed herein are directed to detection under live-conditions. In other words, the transmission lines are energized and not de-energized prior or during detection.

In conventional high voltage alternating current (AC) power systems, leakage current through insulating structures may be measured using AC multimeters such as those made by Fluke™ and a variety of other manufacturers. Such AC multimeters may be operably coupled to an insulator through electrical leads for measuring leakage current flowing through the insulator.

In recent years, transmission of power using high voltage direct current (HVDC) technology has been accepted as an alternative to conventional AC power systems. Insulating structures used in HVDC power systems are also susceptible to the dielectric degradation outlined above. However, due to fundamental differences between alternating current and direct current (bi-directional vs. unidirectional respectively), AC current measuring devices used in AC power systems for detection of leakage current cannot be safely used in a HVDC system.

A scientific paper titled "Insulator Leakage Current Monitoring: Challenges For High Voltage Direct Current Transmission Lines" by M. Roman et al. articulates the differences between AC and direct current (DC) power systems. It also corroborates that there is no direct mapping between AC and DC leakage current measurement devices.

DC meters for the measurement of leakage currents in low power applications, for example under 6 kv, are known. The sampling rate of such DC meters may be typically in the range of 60 to 100 Hz.

During Applicant's attempts to measure leakage current in HVDC systems, Applicant observed that leakage current is a composite DC current comprising transient spikes or discharges. Such discharges are high in magnitude and may be best described as "short duration" or "momentary" or "very narrow" spikes. In other words, the discharges are high in magnitude but typically extremely short in duration. Typically, such spikes have been observed by Applicant to have duration of less than a microsecond to a few hundredths of a second depending upon the energy of the spike. The greater the amplitude and duration, higher the energy. High energy spikes that exist for hundredths of a second are dangerous and represent an immediate risk of flashover. For this reason the lower energy short duration spikes are most critical to detect as they provide a safer and early warning.

In Applicant's experience, as the spikes are momentary, conventional DC meters do not react to such spikes and the spikes are not registered. Applicant believes that in order to capture such momentary spikes, conventional DC meters would have to be modified so that they have significantly higher than conventional sampling rates, for example, at least 10,000 samples/second (10 KHz). In addition these recorded spikes would need to be cataloged, and displayed to a user in a meaningful and timely way.

Therefore, there is a need for a relatively simple and inexpensive DC leakage current detecting apparatus or meter, without the need for a very high sampling rate, may be used with several types of electrically insulating structures in HVDC systems to indicate accurately leakage current voltage spikes flowing through such structures and display detected leakage current in a meaningful and timely way to an operator or user.

SUMMARY

An apparatus for measuring Direct Current (DC) from an energized DC electrical power line may utilize a DC current measuring device to measure a DC leakage current from the energized DC electrical power line, a DC numerical display that displays the DC leakage current measured by the DC current measuring device, and an audio speaker that sounds upon the DC current measuring device measuring a threshold DC leakage current value. An apparatus may further utilize in some combination, a manual DC voltage class selector switch that is manually adjustable to coincide with a DC voltage of the DC electrical power line, an automatic DC voltage class selector switch that automatically switches to coincide with a DC voltage of the DC electrical power line, a graphical display that visually depicts a level of the DC leakage current measured by the DC current measuring device, an aerial work platform for containing and delivering human workers to a height of an energized DC electrical power line, a chassis, such as a crane chassis, bucket truck chassis, trailer or other chassis. The apparatus may also employ an elongate electrically insulating member having an insulating member first end and an insulating member second end, the insulating member first end connected (e.g. electrically) to the chassis, and the insulating member second end connected (e.g. electrically) to the aerial work platform, a conductive lead having a conductive lead first end and a conductive lead second end, the conductive lead first end contacting the energized DC voltage transmission line, and the conductive lead second end contacting the aerial work platform. A corona ring may be attached proximate to the insulating member first end with an exterior collector band attached proximate the insulating member second end. An internal collector band may be attached proximate to the insulating member second end. A DC input lead having a DC input lead first end and a DC input lead second end may be provided with the DC input lead first end contacting the external collector band and the internal collector band. The DC input lead second end may be an electrical input for the DC measuring device. A DC ground or output lead may be provided and have a DC output lead first end and a DC output lead second end. The DC output lead first end may be attached to an electrical ground point of the DC measuring device and the second end of the DC output lead may contact an Earth ground or potential. A plurality of hydraulic lines may traverse an interior of the elongate insulating member. The hydraulic lines may be electrically connected to the DC measuring device. A plurality of fiber optic lines may traverse an interior of the elongate insulating member. The fiber optic lines may be electrically connected to the DC measuring device. A portable casing to be carried by an individual human may substantially retain the DC current measuring device, the DC numerical display, the graphical display and the audio speaker.

The apparatus and methods of any of the present teachings, may be used in conjunction with, or may include an energized DC electrical power line having a voltage between 10,000 volts and 100,000 volts, inclusive, or between 100,000 volts and 200,000 volts, inclusive, or between 200,000 volts and 300,000 volts, inclusive, or between 300,000 volts and 400,000 volts, inclusive, or a voltage between 400,000 volts and 500,000 volts, inclusive, or between 500,000 volts and 600,000 volts, inclusive.

In another example of the present teachings, a portable apparatus for use with an energized DC transmission line may utilize a substantially electrically insulating structure, a DC current measuring device to measure DC current passing through the substantially electrically insulating structure, a DC voltage level switch, a DC display to display a DC current measured by the DC current measuring device at a DC voltage level of the DC voltage level switch, a graphical display to indicate an amperage of the DC current, and an audio speaker to sound at a threshold amperage of the DC current measured by the DC current measuring device. An apparatus may further employ a casing to which the DC current measuring device, the DC voltage level switch, the digital DC display, the graphical display, and the audio speaker, attach. The apparatus may further exhibit a first end of the substantially electrically insulating structure that contacts the energized DC transmission line, and a second end of the substantially electrically insulating structure that contacts an earth ground (i.e. ground voltage, ground potential), an electrical lead having an electrical lead first end and an electrical lead second end, with the electrical lead first end fastened proximate to the second end of the insulating structure and the electrical lead second end fastened to the DC current measuring device. A portable apparatus may also employ a DC ground lead (e.g. an electrically conductive cable) having a DC ground lead first end and a DC ground lead second end, with the DC ground lead first end attached to the DC current measuring device (e.g. an electrical ground point of the DC current measuring device), and the second end of the DC ground lead contacting an Earth ground (e.g. ground voltage or ground potential). As representative examples, the substantially electrically insulating structure may be a ladder, scaffolding, a hydraulic line, a boom (e.g. a crane boom, a bucket truck boom, or an aerial platform device boom), or nearly any fiber reinforced plastic ("FRP") structure used in as an electrically insulating structure.

In another example of the present teachings, an apparatus for use with an energized DC transmission line may utilize an electrically conductive supporting structure of an energized DC electrical power line, an energized DC transmission line located between a surface of Earth and the electrically conductive supporting structure, a first elongate substantially electrically insulating structure contacting each of the electrically conductive supporting structure and the energized DC transmission line, and a DC current measuring device electrically wired in series between the first elongate substantially electrically insulating structure and an electrical ground (e.g. ground potential or ground voltage). A DC current measuring device may be electrically wired in series between the first elongate substantially electrically insulating structure, and an electrical ground may be an electrical lead having an electrical lead first end and an electrical lead second end, the electrical lead first end electrically connected to the first elongate substantially electrically insulating structure and proximate to the electrically conductive supporting structure of the energized DC electrical power line. The electrical lead second end may be fastened to the DC current measuring device. A DC ground lead having a DC ground lead first end and a DC ground lead second end, may have the DC ground lead first end attached to an electrical ground point of the DC current measuring device, and the DC ground lead second end in contact with an Earth ground (e.g. ground potential or ground voltage). The structure having Earth potential or Earth ground may be the electrically conductive supporting structure. A second elongate substantially electrically insulating structure may contact each of the electrically conductive supporting structure and the energized DC transmission line. The DC current measuring device may also be electrically connected in series to the second elongate substantially electrically insulating structure.

The DC current measuring device may be electrically connected in series to the second elongate substantially electrically insulating structure to measure a momentary leakage current passing through both the first elongate substantially electrically insulating structure and the second elongate substantially electrically insulating structure, when the first and second structures are electrically connected. The first elongate substantially electrically insulating structure and the second elongate substantially electrically insulating structure may be substantially parallel to each other, and may be in tension due to a weight of the energized DC electrical power line suspended from the elongate substantially electrically insulating structures. The apparatus may further employ a DC voltage selector switch that adjusts manually or automatically to coincide with a DC voltage level of the energized DC electrical power line, a DC numerical display that displays the DC current measured by the DC current measuring device, an audio speaker that sounds upon the DC current measuring device measuring a threshold DC current value, a graphical display that visually depicts a level of the DC leakage current measured by the DC current measuring device, and a hand-held casing to which the DC current measuring device, the DC voltage selection switch, the digital and graphical display, and the audio speaker are attached or encased.

A process of the teachings of the present invention may be providing an energized DC electrical line above an Earthen surface (i.e. a surface of the Earth), electrically connecting or electrically bonding a substantially electrically insulating structure against the energized DC electrical line and the Earthen surface (or surface with Earth potential), providing a DC current meter, in series between the insulating member and the Earthen surface, a DC current meter, and measuring a DC momentary leakage current flowing through the insulating member with the DC current meter. DC momentary leakage current is considered to be direct current that flows through, despite how relatively minuscule or not minuscule, a substantially electrically insulating structure (e.g. an FRP or fiber reinforced plastic or other material largely considered to be insulating). Measuring a DC momentary leakage current that passes through the insulating member with the DC current meter, may further entail measuring every 1/60th or 1/120th of a second with the DC current meter, the DC momentary leakage current flowing through the insulating member or substantially electrically insulating structure. The process may further include storing in a digital memory, a plurality of momentary leakage current values measured by the DC current meter; and comparing the plurality of momentary leakage current values measured by the DC current meter to a predetermined threshold current value indicative of a DC flashover current value for the substantially electrically insulating structure. Depending upon the comparison of the values, the process may also entail sounding an audible alarm when any of the plurality of momentary leakage current values measured by the DC current meter is larger than the predetermined threshold current value and activating a visible alarm when any of the momentary leakage current values measured by the DC current meter is larger than the predetermined threshold current value. Still yet, the process may include calculating a moving average for the plurality of momentary leakage current values, comparing the moving average to a predetermined threshold current value indicative of a DC current flashover current value for the substantially electrically insulating structure, and sounding an audible alarm when the moving average of the plurality of momentary leakage current values measured by the DC current meter is larger than the predetermined threshold current value.

In another example, a process may include providing an energized DC electrical line above a surface of the Earth, locating a first end of a substantially electrically insulating structure proximate (e.g. near enough to experience circulating current or induction current, or electrically attached with an electrically conductive jumper cable) the energized DC electrical line, locating a second end of a substantially electrically insulating structure proximate an Earthen surface, providing, in series between the insulating member and the Earthen surface, a DC current meter, and measuring a plurality of momentary leakage current values flowing through the substantially electrically insulating structure using the DC current meter. The process may further include measuring every 1/60th of a second (or other time interval), a DC momentary leakage current flowing through the substantially electrically insulating structure using the DC current meter, calculating a moving average for the plurality of momentary leakage current values, storing in a digital memory, the plurality of momentary leakage current values measured by the DC current meter, and comparing the plurality of momentary leakage current values measured by the DC current meter to a predetermined threshold current value indicative of a DC current flashover current value for the substantially electrically insulating structure, and sounding an audible alarm when any of the plurality of momentary leakage current values measured by the DC current meter is larger than the predetermined threshold current value. The process may also include activating a visible alarm when any of the plurality of momentary leakage current values flowing through the substantially electrically insulating structure measured by the DC current meter is larger than the predetermined threshold current value. The process may further include locating a first end of a substantially electrically insulating structure proximate the energized DC electrical line, electrically connecting a first end of a substantially electrically insulating structure to the energized DC electrical line and the Earthen surface. Locating a second end of a substantially electrically insulating structure proximate an Earthen surface, may further include locating a second end of a substantially electrically insulating structure proximate on a surface that has Ground potential. The process may further include calculating a moving average for the plurality of momentary leakage current values; storing in a digital memory, the plurality of momentary leakage current values measured by the DC current meter, and comparing the plurality of momentary leakage current values measured by the DC current meter to a predetermined threshold current value indicative of a DC current flashover current value for the substantially electrically insulating structure.

Calculating a moving average for the plurality of momentary leakage current values may further include calculating a moving average using a predetermined number of momentary leakage current values measured in succession by the DC current meter by excluding the first momentary leakage current value of a series of momentary leakage current values and including the next momentary leakage current value following an immediately prior subset of momentary leakage current values used to calculate an average. The process may further include sounding an audible alarm when any of the plurality of momentary leakage current values measured by the DC current meter is larger than the predetermined threshold current value. The process may further include predicting electrical flashover of the substantially electrically insulating structure from one of the momentary leakage current values that is measured by the DC current meter by comparing the DC momentary leakage current value to a predetermined threshold value indicative of a DC current flashover value of the substantially electrically insulating structure. The process may include displaying on a DC numerical display of the DC current meter, the DC momentary leakage current, sounding an audio alarm upon the DC current measuring device measuring a threshold value of the DC momentary leakage current, displaying on a graphical display, the threshold value for the substantially electrically insulating structure, and displaying on the graphical display, the DC momentary leakage current measured by the DC current meter. The substantially electrically insulating structure may be a hydraulic line, a boom, or any such structure that is made from a fiber reinforced plastic material or other insulating material.

In another example, a process may include measuring direct current (DC) through a material by providing a DC meter capable of measuring amperage at voltages of an electrically energized DC power line, providing an electrically energized DC power line to supply DC through a substantially dielectric material, measuring the DC passing through the substantially dielectric material to determine an instantaneous DC amperage value, comparing the instantaneous DC amperage value to a known DC amperage flashover value for the substantially dielectric material, and activating an alarm when the instantaneous DC amperage value is equal to or greater than the known DC amperage flashover value for the substantially dielectric material.

Measuring the DC passing through the substantially dielectric material to determine an instantaneous DC amperage value, may include repeatedly measuring the DC passing through the substantially dielectric material to create a plurality of instantaneous DC amperage values, and calculating a moving average using the plurality of instantaneous DC amperage values. Activating an alarm when the instantaneous DC amperage value is equal to or greater than the known DC amperage flashover value for the substantially dielectric material may further include providing a DC portable meter, and displaying the instantaneous DC amperage value on a visible display of the DC portable meter. The electrically energized DC power line may be between 38 kV and 600 kV, inclusive.

DC leakage current consists entirely of fast DC transients (spikes). Leakage current spikes are random in occurrence, amplitude and duration. Polarity of these transients depends on the polarity of DC transmission line. The average value (DC) of these spikes depends on their occurrence, amplitude and width. Duration of the spikes is dominantly very short, in range of few microseconds or less. A sampling Analog/Digital converter (ADC) cannot accurately sample leakage current without an extremely high sample rate, probably in 100 Ks/sec, which likely would not be practically possible. Knowing both average value of the spikes and their number/sec gives us an indication of incoming catastrophic breakdown/flashover. In the present invention leakage current is separated into two components using analog filters and amplifiers. The DC component is sampled by a microcontroller ADC at a fairly low rate and further processed. The AC components are digitized by a voltage comparator, and in particular there are positive and negative current spike comparators. The comparators threshold level is adjustable and gives 0-5V pulses proportional to the leakage current spikes. A microprocessor counts pulses coming from the comparators. Only one of the comparators produces digital output pulses. Which comparator depends on the polarity of the leakage current. This provides for measurement of either polarity of the leakage current without swapping input or having to switch.

Accordingly in one aspect, a waveform separator system for determining DC leakage current flowing through an insulating structure in a high voltage direct current power system is provided. The DC leakage current is a composite DC current comprising one or more high magnitude momentary spikes, and having a DC component and an AC component. The system comprises a waveform separator configured to receive the composite DC current flowing through the insulating structure and to separate the composite DC current into corresponding direct current (DC) and alternating current (AC) component. The AC component has a first rate of change, and the DC component has a second rate of change. The first rate of change is greater than the second rate of change. The system further comprises at least one comparator configured to receive the AC component and produce at least one corresponding digital signal. The system also includes a processor configured to: (a) receive the at least one corresponding digital signal and the DC component, (b) analyze the at least one corresponding digital signal and the DC component, and (c) determine a resultant leakage current flowing through the insulating structure.

Accordingly in another aspect, a method for determining DC leakage current flowing through an insulating structure in a high voltage direct current power system is provided. The DC leakage current is a composite DC current comprising one or more high magnitude momentary spikes, and having DC components and AC components. The method comprises separating the composite DC current into its slow-moving direct current (DC) component and fast-moving alternating current (AC) component. The method also comprises analyzing the fast-moving AC component and producing at least one digital signal corresponding to the fast-moving AC component. Further, the method comprises analyzing the at least one corresponding digital signal and the slow-moving DC component for determining a resultant leakage current flowing through the insulating structure.

Accordingly in another aspect, a method for determining DC current leaking through a dielectric material is provided. The dielectric material is electrically coupled to an energized power line conducting DC current. The DC current leaking through the dielectric material is a composite DC current comprising one or more high magnitude momentary spikes, and having a DC component and an AC component. The method comprises separating the composite DC current into its direct current (DC) component and alternating current (AC) component. The method also comprises analyzing the AC component and producing at least one digital signal corresponding to the AC component. Further, the method comprises analyzing the at least one corresponding digital signal and the DC component for determining a resultant DC current leaking through the dielectric material.

Accordingly in another aspect, a process is provided. The process comprises providing an energized DC electrical line above an Earthen surface. The process also comprises locating a first end of a substantially electrically insulating member proximate the energized DC electrical line and locating a second end of the substantially electrically insulating member proximate the Earthen surface. In addition, the process comprises providing, in series between the insulating member and the Earthen surface, a DC current meter for measuring a composite DC current leaking through the insulating member. Further, the process comprises determining a resultant leakage current passing through the insulating member using the DC current meter.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of a preferred arrangements, it should be understood that the inventive features and concepts may be manifested in other arrangements and that the scope of the invention is not limited to the embodiments or examples described or illustrated. The scope of the invention is intended only to be set forth by the scope of the claims that follow. Each embodiment or example is provided by way of explanation of the invention, one of many embodiments of the invention, and the following examples should not be read to limit, or define, the scope of the invention.

Figure 1:
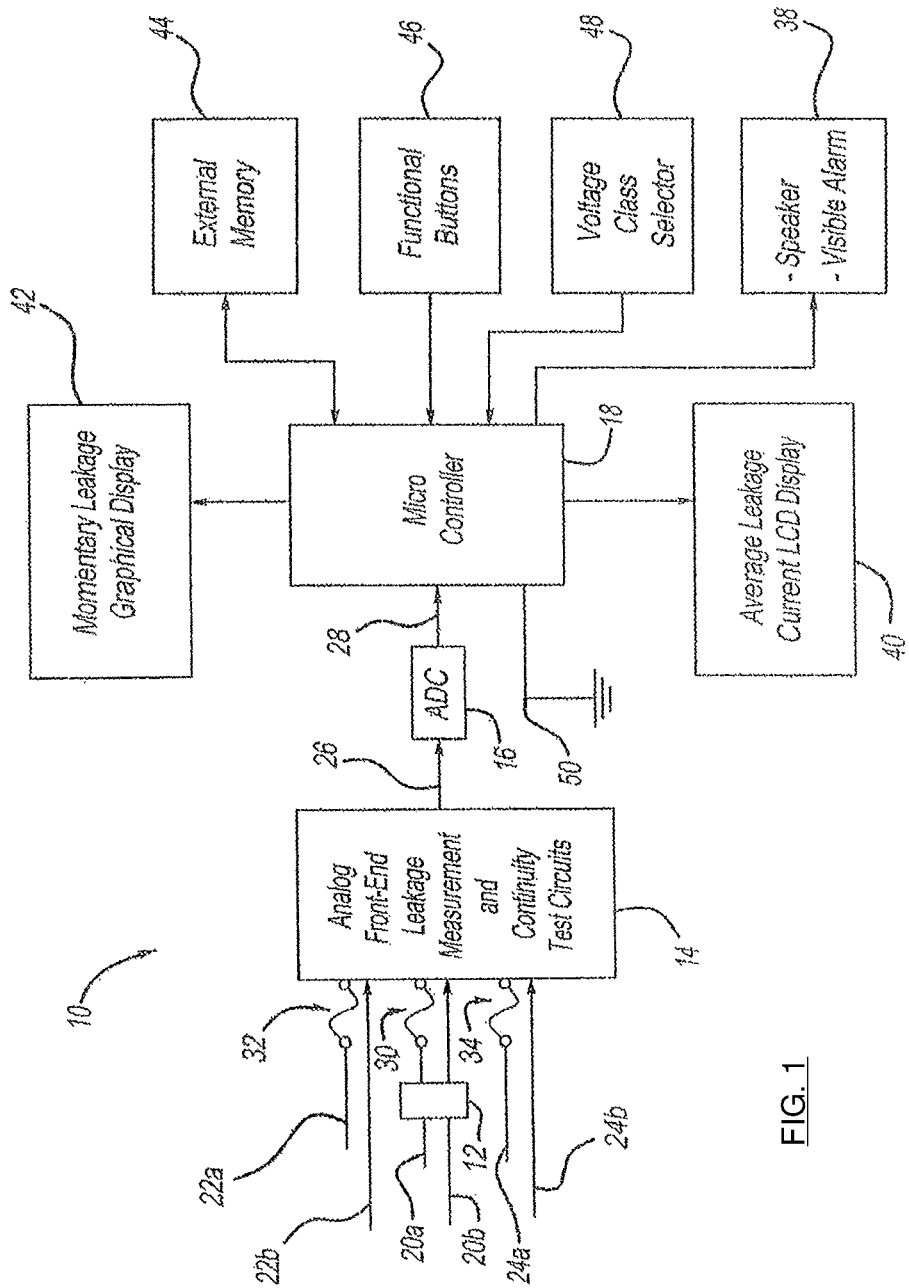
FIG. 1 is a schematic depicting internal components of a voltage meter and associated user-readable displays in accordance with teachings of the present disclosure.

FIG. 1 is a schematic view of components of a DC current meter 10 in accordance with teachings of the present invention. DC current meter 10 may include an electrically conductive collector 12, an analog front-end 14, which is a current receiver that receives or collects current from electrically conductive collector 12 to be measured and used as an input 26 for an analog-to-digital converter 16, also known in abbreviated form as "ADC", whose digital output signal 28 is used as an input for a micro-controller 18, which is also a computer. With reference including FIG. 5, multiple sources of electrical current to be used as input into the analog front end 14 of ADC 16 may be electrical current from a boom 20, electrical current from one or more of a type of hydraulic line 22, and electrical current from a leveling rod or one or more of a fiber optic cable 24, or both a leveling rod or one or more of a fiber optic cable 24. For example, electrical lines 20a, 20b may carry electrical current from boom 20 such that electrical line 20a may carry current from an interior surface or inside diameter surface of boom 20, and electrical line 20b may carry current from an exterior surface or outside diameter surface of boom 20, as depicted, to electrically conductive collector 12. Electrical lines 22a, 22b may each carry electrical current from a single hydraulic line 22 or one or more hydraulic lines 22 to electrically conductive collector 12. Electrical lines 24a, 24b, may each carry electrical current from fiber optic cable 24 to electrically conductive collector 12. In place of, or in additional to fiber optic cable 24, a leveling rod may conduct and carry electricity to electrically conductive collector 12. Although electric lines, fiber optic cables, hydraulic lines, and one or more leveling rods are used as specific examples of structures for which current passing through such structure may be measured, the teachings of the present disclosure may be employed to measure or monitor electrical current for any structure, which may be an insulating structure, if desired.

With reference again to FIG. 1, after electrical current from each of boom 20, hydraulic line 22, and fiber optic cable 24 passes onto or into electrically conductive collector 12, such electrical current may then pass into analog front end 14. For example, electrical current from boom 20 passes through electrical lines 20a, 20b and through a fuse 30, which is an electrical protective device to protect all electrical downstream components from a power surge, before entering analog front-end 14. Electrical current from one or more hydraulic lines 22 may pass through electrical lines 22a, 22b, and through a fuse 32, which is an electrical protective device to protect all electrical downstream components from a power surge, before entering analog front-end 14. Electrical current from one or more fiber optic cables 24 may pass through electrical lines 24a, 24b, and through a fuse 34, which is an electrical protective device to protect all electrical downstream components from a power surge, before entering analog front-end 14. Instead of a fuse 30, 32, 34 which may be a one-time-use type of device when employed for its purpose, a different device with the same current interrupting or stopping purpose may be substituted, such as a circuit breaker, which may be resettable.

Analog front end 14 measures the amperage flowing from electrical input collector 12 which is a measurement also referred to as "leakage current" because current is flowing through devices such as boom 20, hydraulic line 22, and fiber optic cable 24, which are designed and known to be insulating devices to the extent their materials permit them to be insulating or insulative given the voltage to which boom 20, hydraulic line 22, and fiber optic cable 24 that are directly or ultimately connected. Thus, any current that passes through such otherwise insulating devices is known as "leakage current" rather than simply current. Measuring of such leakage current is performed in analog front end 14, which also performs an electrical continuity test on each of any connected boom 20, hydraulic line 22, and fiber optic cable 24. Measuring current or leakage current, such as DC current, through other devices is possible by using the teachings of the present invention.

Analog front end 14 is an electrical circuit and may employ high precision shunt resistors for each channel creating a path to ground. Alternatively, a Hall effect sensor can be used instead of one or more shunt resistors. A Hall effect sensor may be arranged in any necessary position relative to the device from which to measure magnetic current. As an example, the Hall effect sensor may be arranged parallel to, or otherwise proximate to, a capacitor or other electric circuit component, with a lead to ground. The Hall effect sensor may be used to detect a magnetic field that translates to a current, such as direct current. The shunt resistors are monitored by high bandwidth and high gain amplifiers for potential difference (i.e. voltage) across them, induced by current (also known as leakage current) flowing to ground. Its resistor and amplifier design will allow for bi-directional leakage current detection for a scale of +/−0 to 500 microamperes or single-ended +/−0 to 1000 microamperes range. The output of an amplifier may be amplified again (e.g. once more) before being input into analog to digital converter 16 as input 26. The amplifier output, which is input 26, will go to analog to digital converter 16 employing a precision high-speed ADC chip. Alternatively input 26 may be directed directly to microcontroller 18 and thereby bypass a separate ADC 16 if microcontroller 18 is equipped with its own built-in ADC, which may depend upon specific application requirements. The specific application requirements that may dictate whether a separate ADC is used, or input signal 26 goes directly in microcontroller 18 may be the bandwidth of the input signal, and the accuracy and precision of the detected current. The operation or functionality is such that leakage current passing through the internal shunt resistors from the test insulation connections of the boom equipment, will create a potential difference across the resistor with reference to ground. Any analog-to-digital converter, whether it is a separate ADC outside of microcontroller 18 or within microcontroller 18, converts the analog voltage level to a digital representation, which can then be processed by microcontroller 18 to perform various outputs such as an audible trigger alarm(s) from speaker 38, a readable display on an LCD display 40, a graphical display such as a momentary leakage current graphical display 42, and then store or log all output or results to memory 44, which may be an external memory device as a separate component from microcontroller 18.

FIG. 1 depicts one or more function buttons 46. Function buttons may be input controls to control functions of the microcontroller in accordance with the present invention. For instance, one function may be an on and off switch to supply or electricity or power to, and prevent power or electricity from flowing to microcontroller 18. Another function button 46 may be a continuity test button, also known as a self-test button. Such a test when initiated by pressing such a button, permits the microcontroller to cause electricity to test the continuity of each of the electrical wires 20a, 20b, 22a, 22b, 24a, 24b to ensure that no electrical open circuits or breaks in continuity in any of the leakage current electrical wires 20a, 20b, 22a, 22b, 24a, 24b exists. Other functions to invoke with a function button 46 are possible. A voltage class selector 48 may function to permit a user to manually select a voltage class, range or upper limit at which a voltage meter, such as DC voltage meter 10, may properly function. Alternatively, voltage class selection may be performed automatically, and internally within DC voltage meter 10 upon DC voltage meter 10 sensing or measuring voltage. Thus, no manual voltage selection need be performed with a switch such as voltage class selector 48. Examples of voltage classes are: from 0-400 kV, 0-500 kV, and 0-600 kV. Other DC voltage classes are possible. Thus, in accordance with the present teachings, voltage class selector 48 could have three distinct positions, or more. A ground wire 50 that creates an electrical path to Earth permits functions, such as test functions and current monitoring within microcontroller 18, and functioning of current meter 10 itself, to properly work.

Figure 2:
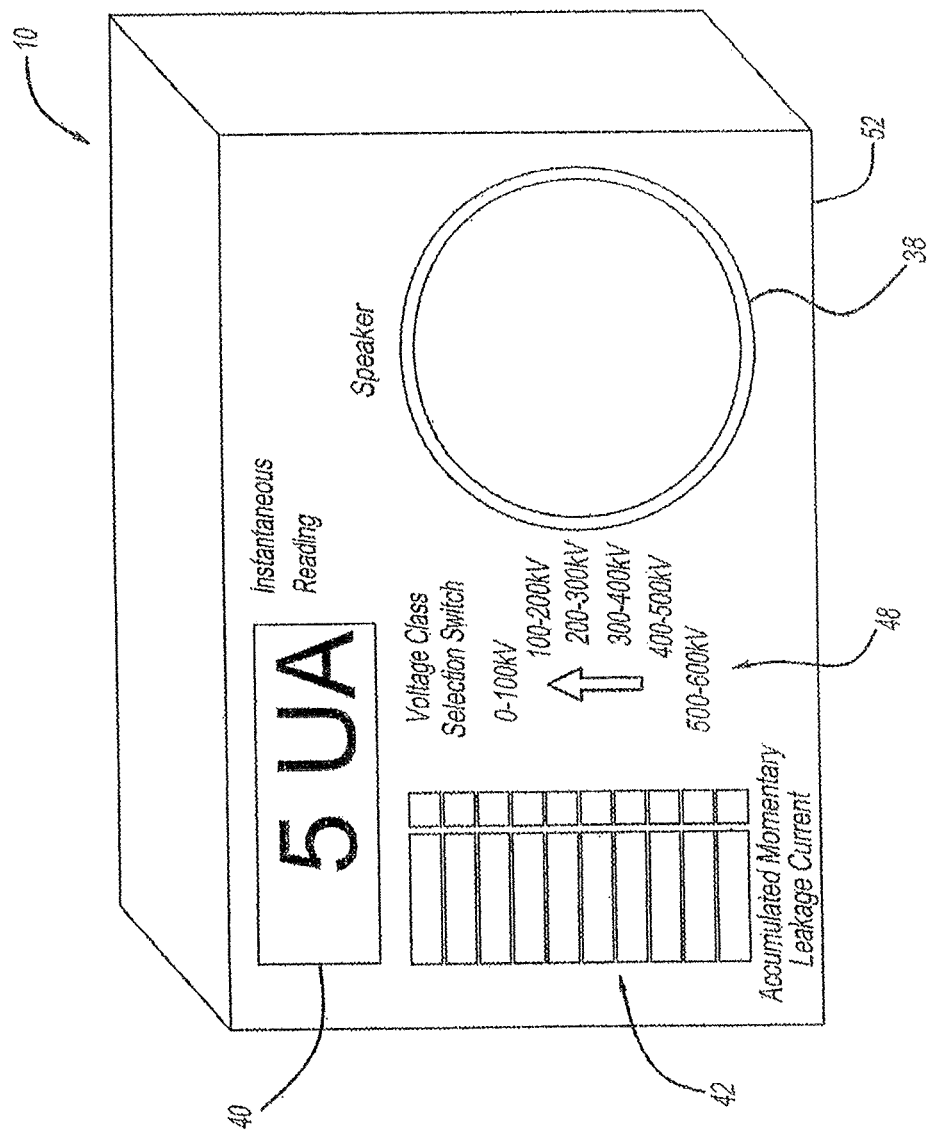
FIG. 2 is a perspective external view of a voltage meter encased within a housing to contain its operative parts and promote portability.

FIG. 2 is an external view of DC current meter 10 with most of the operative components enclosed within a casing 52. Portability is enhanced by enclosing the components of DC current meter 10 within casing 52. FIG. 2 is one example of how an instantaneous reading or readout, such as an LCD display 40, an audio speaker 38, a voltage class selector switch 48 and an accumulated average and/or momentary leakage current graphical display 42, may be arranged or positioned within and around a surface of casing 52.

Figure 3:
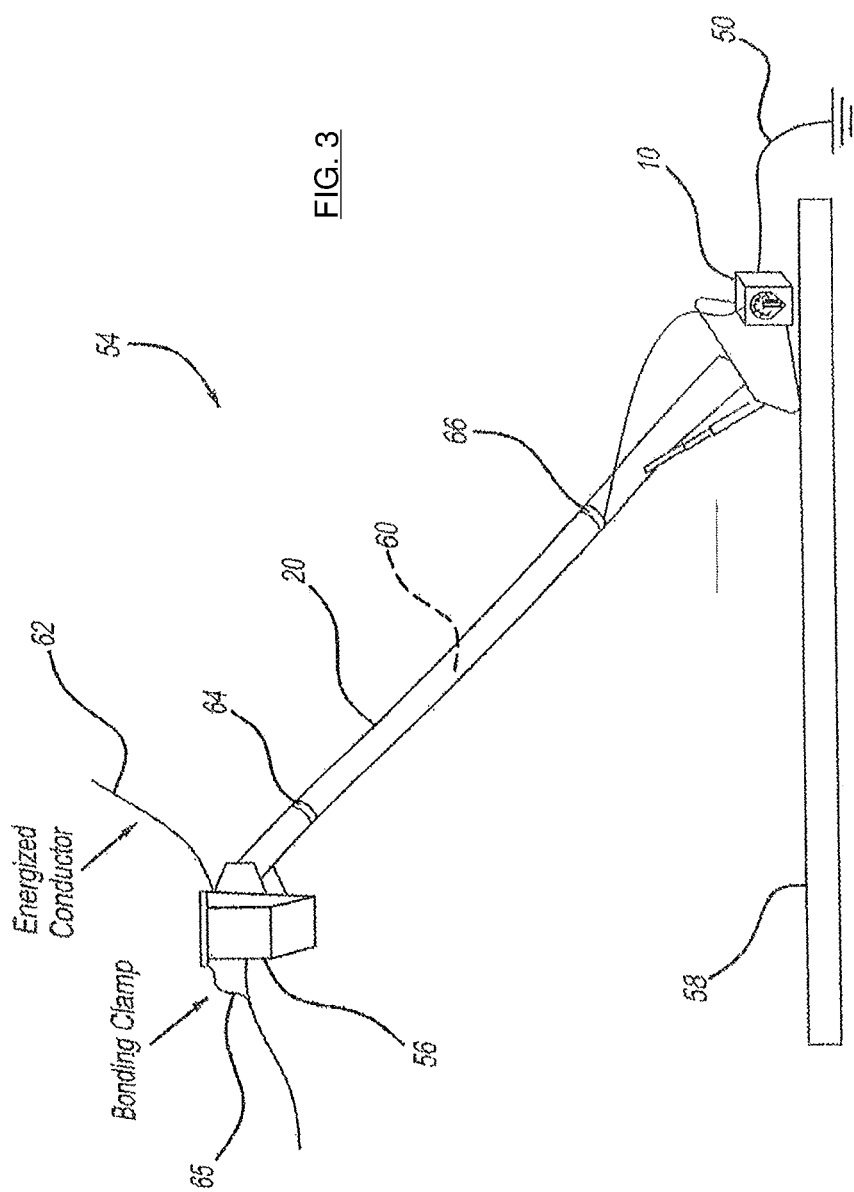
FIG. 3 is a perspective view of a voltage meter located in an example in-use location to monitor direct current that passes through an insulated boom from a direct current voltage line in accordance with teachings of the present disclosure.

FIG. 3 depicts DC current meter 10 in an in-use position with an aerial lift device 54 equipped with a bucket 56 for human occupants. The aerial lift device 54 may be mounted to a truck, vehicle, or trailer chassis 58, or similar platform, the chassis 58 may or may not have wheels. When DC current meter 10 is in use, a boom 20, which may be a fixed length, or extendable in a telescoping fashion, may be extended such that bucket 56 resides beside an energized (i.e. live) high voltage direct current power line 62 so that human occupants within bucket 56 can perform maintenance on, or further construct, high voltage direct current power line 62. When current meter 10 is in use, bucket 56, which may be constructed with metallic components, is placed at the same potential (i.e. voltage) as DC power line 62. Similarly, a human occupant within bucket 56 is also placed at the same potential as DC power line 62. In order place bucket 56 and any human occupant within the bucket 56 at the same potential as DC power line 62, a bonding clamp 65 is used. Bonding clamp 65 provides an electrical link to bucket 56 and human occupants to achieve a common potential for the DC power line 62, bonding clamp 65 and bucket 56. Bucket 56 is pivotably attached to telescoping boom 20 to permit relative motion between bucket 56 and telescoping boom 20. Telescoping boom 20 is an electrically insulating member made from fiberglass, or fiberglass and other non-conductive materials, which may include plastics and other materials.

Figure 4:
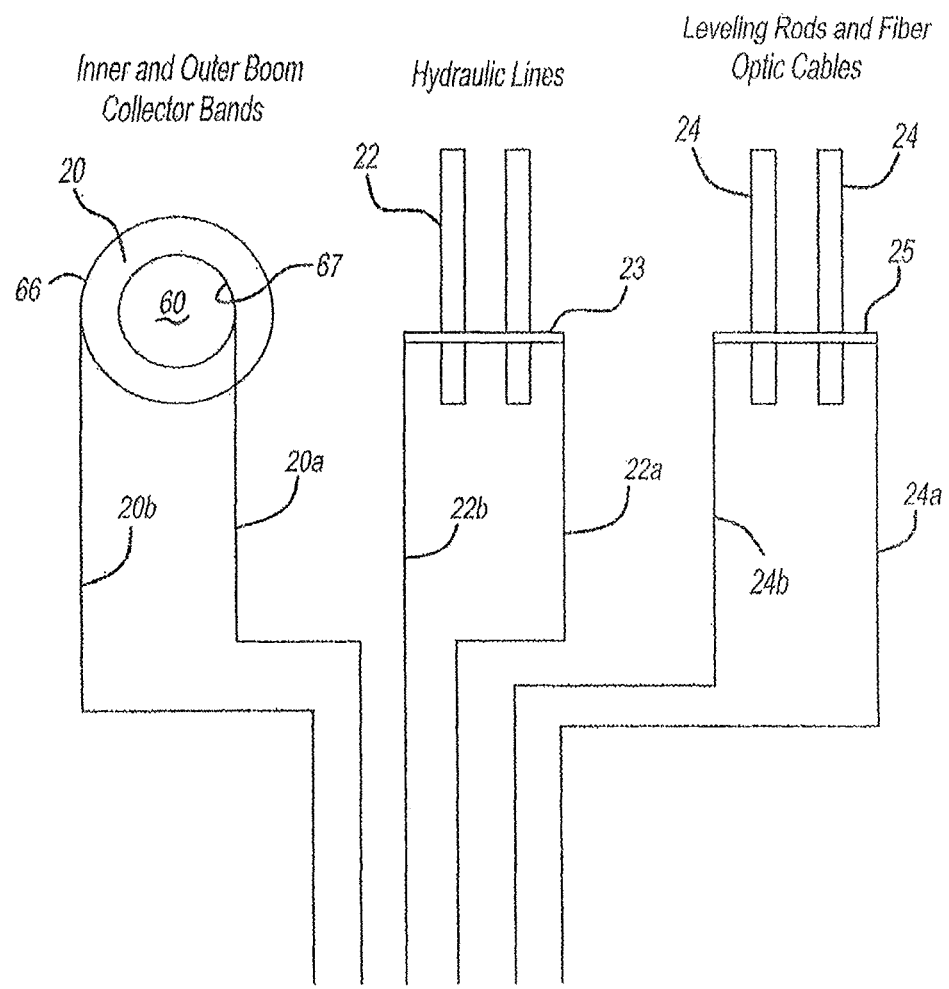
FIG. 4 is a diagram depicting components to which a voltage meter may be electrically connected to monitor voltage in accordance with teachings of the present disclosure.

Continuing with FIG. 3, mounted to telescoping boom 20 proximate to bucket 56 is a corona ring 64. Corona ring 64 may be mounted within three meters or within three yards of the junction of boom 20 and bucket 56, or where most electrically advantageous. At an opposite end of boom 20, proximate a truck chassis 58, other mounting platform or lowest pivot point of boom 20, an outer collector band 66 and an inner collector band 67 may be mounted to and against, an exterior and an interior, respectively of boom 20. Boom 20 may be hollow and used as a conduit or passageway for components depicted in FIG. 4, such as one or more hydraulic lines 22, electric lines 22a, 22b, and one or more fiber optic cables 24, and electric lines 24a, 24b. As also depicted in FIG. 4, electric lines 20a, 20b are attached to boom 20, and at least electric line 20a may traverse boom interior 60, while electric line 20b may traverse or run along some length of an exterior surface or interior surface of boom 20. At a base of boom 20, an electrical collection point exists for all structures being monitored for current flow, which may be an input for meter 10. Each of hydraulic lines 22, fiber optic cables 24, and boom 20 are made of a dielectric material and have electrical insulating qualities; however, even dielectric and insulating materials will permit some relative quantity of current to pass, and the teachings of the present invention including voltage meter 20, are designed to detect that level of current and alert a user of the invention.

Figure 5:
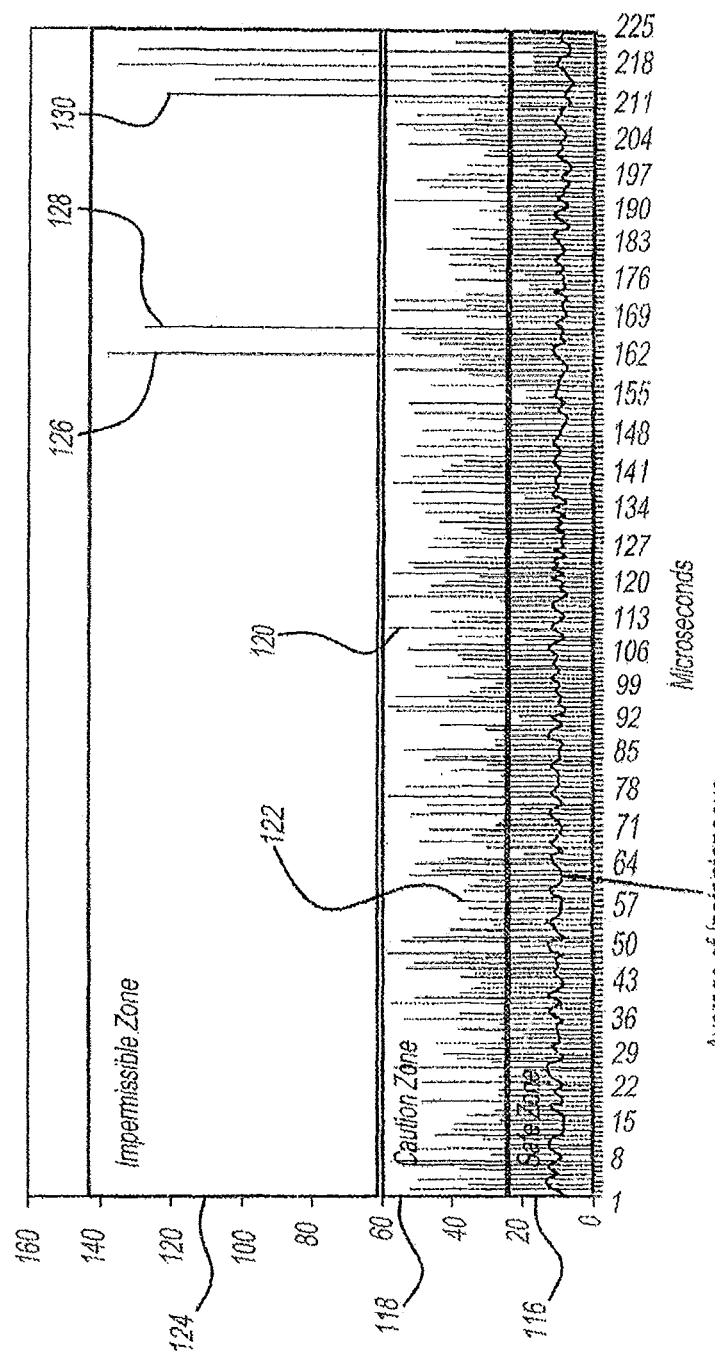
FIG. 5 is a graph of DC current versus time, for a voltage class, showing DC current readings, in an example measuring scenario using the current meter in accordance with teachings of the present disclosure.

FIG. 5 is a graph of current measurements versus time 68 in an example measuring scenario using current meter 10 in accordance with teachings of the present invention. The zones within the graph of FIG. 5 will be explained later during a presentation of operation of the teachings of the present invention.

Figure 6:
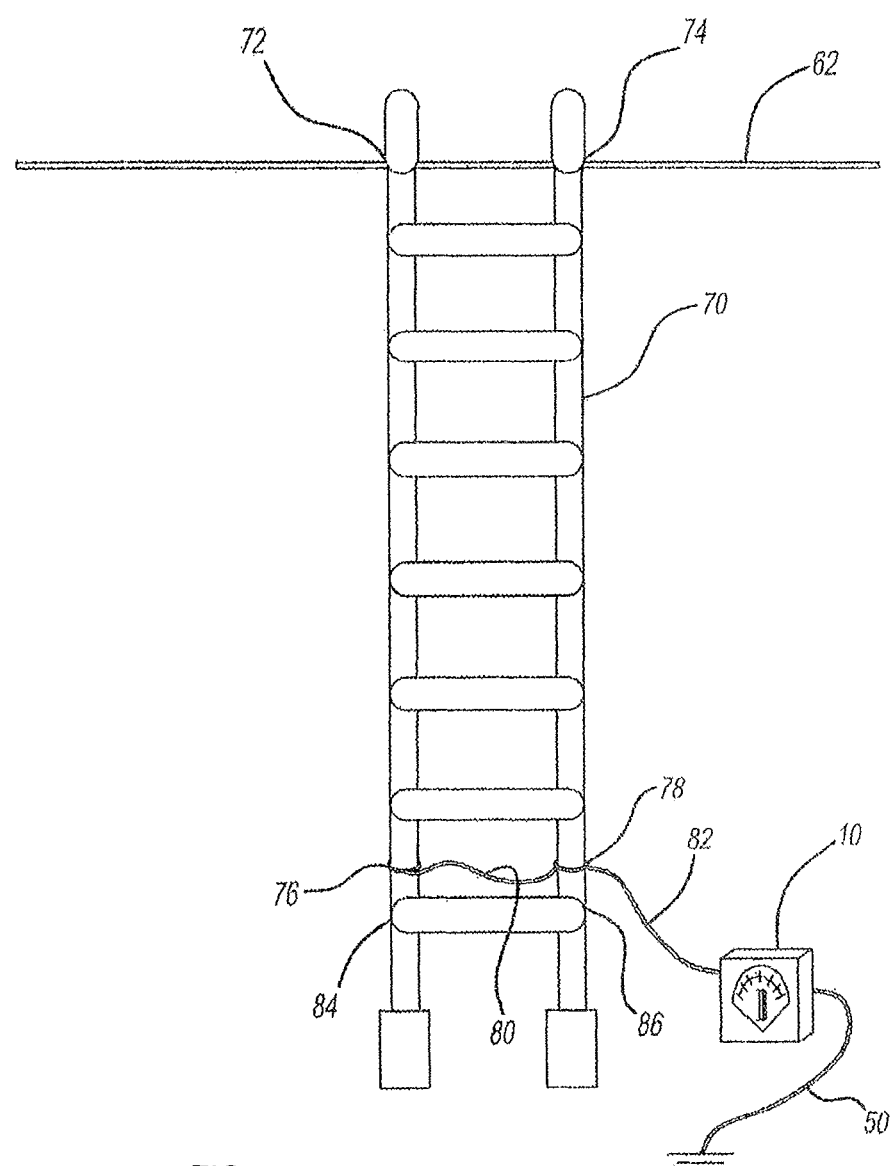
FIG. 6 is a view of an insulating ladder arranged in contact with an energized conductor and a voltage meter, for measuring current passage through the insulating ladder, in accordance with teachings of the present disclosure.

FIG. 6 depicts an insulating ladder 70 arranged in contact with an energized electrical conductor 62 at contact points 72, 74, and a current meter 10 electrically connected to insulating ladder 70. At the lower end of insulating ladder 70, a first electrically conductive clamping ring 76 surrounds and contacts a first ladder leg 84, and a second electrically conductive clamping ring 78 surrounds and contacts a second ladder leg 86. A clamp ring jumper wire 80 electrically connects to each of first electrically conductive clamping ring 76 and second electrically conductive clamping ring 78. Although either electrically conductive clamping ring 76, 78 may be used, FIG. 6 depicts a meter lead in wire 82 conduct electricity from each of first electrically conductive clamping ring 76 and second electrically conductive clamping ring 78 and to current meter 10. Current meter 10 is the same current meter 10 depicted in FIG. 1 and FIG. 2, although in the arrangement depicted in FIG. 6, meter lead in wire 80 is a single conductive wire. The arrangement of FIG. 6 permits current meter 10 to detect leakage current passing from DC power line through the insulating ladder and to ground 50.

Figure 7:
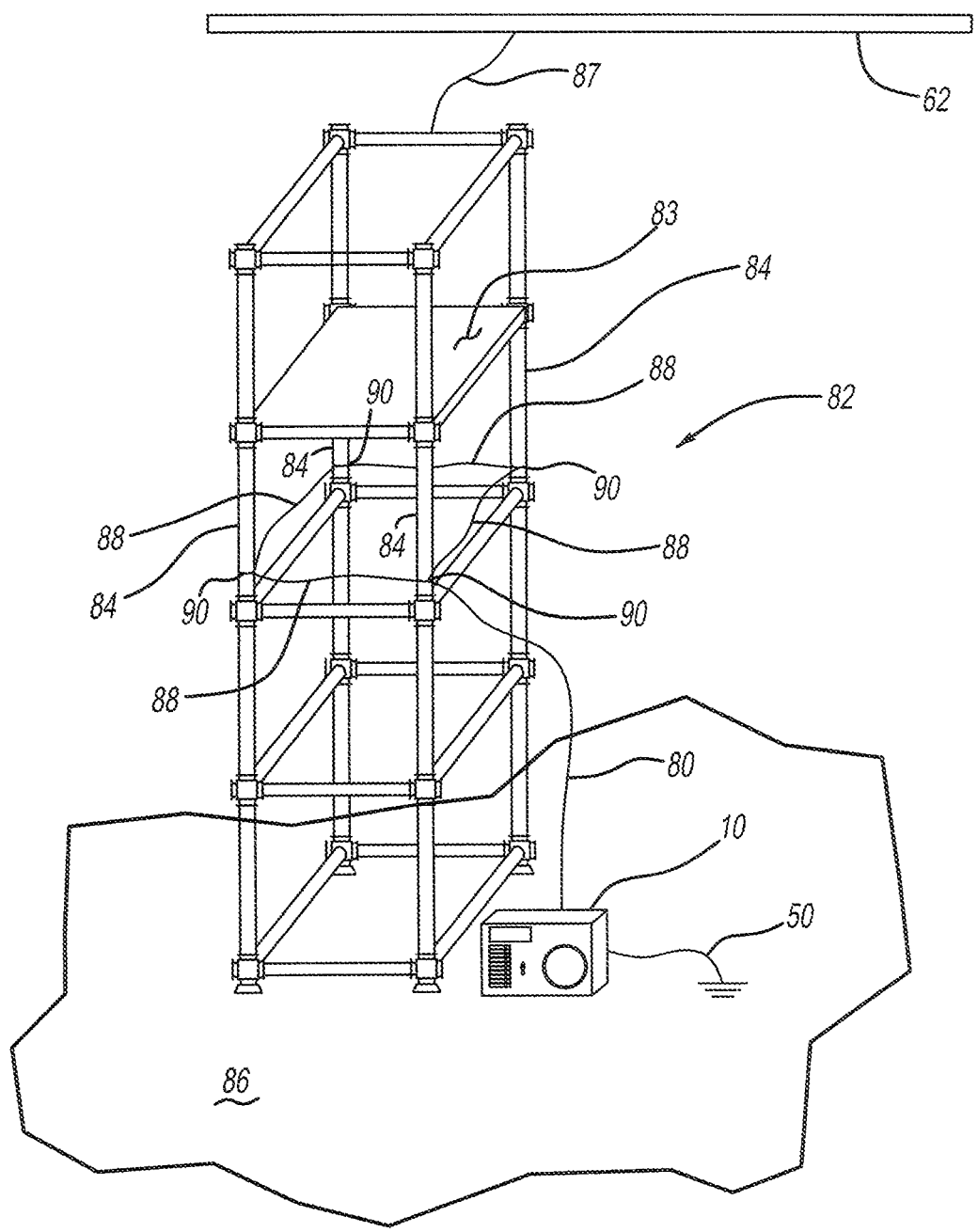
FIG. 7 is a view of insulating scaffolding arranged in contact with an energized conductor and a voltage meter, for measuring current passage through the insulating scaffolding, in accordance with teachings of the present disclosure.

FIG. 7 depicts another embodiment of the present teachings in which the electrically insulating structure is an insulating scaffolding 82, arranged in electrical contact with an energized DC conductor 62, such as with electrical jumper 87. When a human worker is resident upon horizontal platform 83, DC current meter 10 may be electrically connected to insulating scaffolding 82 to monitor the leakage current through insulating scaffolding 82. More specifically, in a given horizontal plane at some distance from either an Earthen surface 86 upon which insulating scaffolding 82 may reside, or at some distance from energized DC conductor 62, each of vertical posts 84 passing through such horizontal plane are electrically connected with an electrically conductive wire 88 or multiple pieces of electrically conductive wire 88. Electrically conductive wire 88 may be secured against each vertical post 84 by an electrically conductive clamp ring 90 to permit a continuous electrical loop of electrically conductive wire 88, which securely holds electrically conductive clamp ring 90 and electrically conductive wire 88. Thus, a continuous loop from vertical pole to vertical pole around insulating scaffolding 82 is created. From one of electrically conductive wires 88, meter lead-in wire 80 is connected to create an electrically conductive link from electrically conductive wire 88 to current meter 10. The arrangement of FIG. 7 will measure DC current passage through the insulating scaffolding and into ground via ground wire 50.

Figure 8:
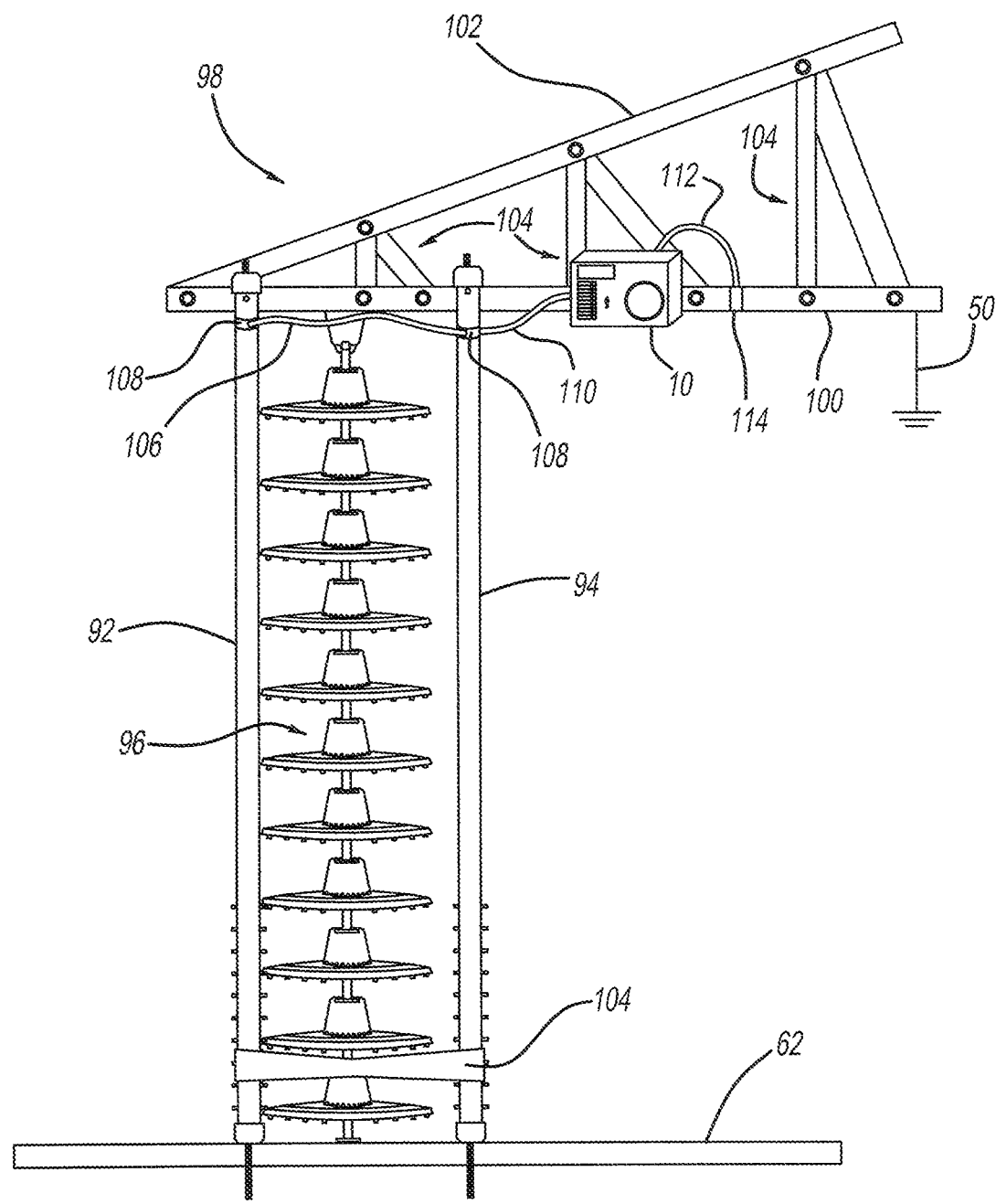
FIG. 8 is a view of an insulating hot stick used during a replacement of an insulator on a power line, in accordance with teachings of the present disclosure.

FIG. 8 depicts a first electrically insulating hot stick 92, a second electrically insulating hot stick 94 and current meter 10 used during a replacement of an insulator 96 on a DC power line 62. As would be known to one skilled in the art, a hot stick is a name used by linemen and others engaged in the trade of maintaining, constructing and reconstructing energized, or live, DC power lines, for specific types of insulated poles. Hot sticks are also tools, usually made of fiberglass, or fiberglass and other insulating material(s). The hot sticks prevent, for practical purposes, electrical current from traveling from DC power line 62 to ground 50.

Continuing with FIG. 8, use of current meter 10 during a typical scenario involving replacement of an aged or otherwise compromised insulator 96 may involve a conductor supporting structure 98, such as part of a lattice tower or any powerline supporting structure that is grounded and thus at the potential of ground 50 (i.e. in the industry known as ground potential). As part of conductor supporting structure 98, FIG. 8 depicts an approximately horizontal, or horizontal beam 100, with, relative to horizontal beam 100, an angled beam 102. Horizontal beam 100 and angled beam are joined by connective structures 104 to increase strength. With first insulating hot stick 92 and second insulating hot stick 94 attached to conductor supporting structure 98, such as to horizontal beam 100, first insulating hot stick 92 and second insulating hot stick 94 hang to the same or approximately the same length as insulator 96. First insulating hot stick 92 and second insulating hot stick 94 may be separated at a specified distance by a limiting bracket 104. Each of first insulating hot stick 92 and a second insulating hot stick 94 is affixed to energized DC power line 62 by clamping or some suitable device, and similarly each of first insulating hot stick 92 and a second insulating hot stick 94 is affixed to horizontal beam 100 by clamping or some suitable device. Limiting bracket 104 may be located proximate energized DC power line 62. When first insulating hot stick 92 and second insulating hot stick 94 are in place as depicted in FIG. 8, insulator 96 may be removed and instead of insulator 96, before removal, bearing the tensile load due to gravity of energized DC power line 62, each of first insulating hot stick 92 and second insulating hot stick 94 bears half the tensile load of energized DC power line 62.

FIG. 8 also depicts current meter 10 affixed in some fashion to conductor supporting structure 98. Additionally, an electrically conductive jumper 106 located between first insulating hot stick 92 and second insulating hot stick 94, creates an electrical path between the two hot sticks 92, 94. Electrically conductive jumper 106 is securely fastened to each of first insulating hot stick 92 and second insulating hot stick 94 by an electrically conductive clamp 108 that is clamped to each junction. From one of electrically conductive clamp 108 to current meter 10, a meter electrical lead wire 110 permits leakage current to flow to current meter 10. A conductive ground lead 112, clamped to conductor supporting structure 98 with clamp 114, completes an electrical current path via conductor supporting structure 98 to Earth ground 50.

Figure 9:
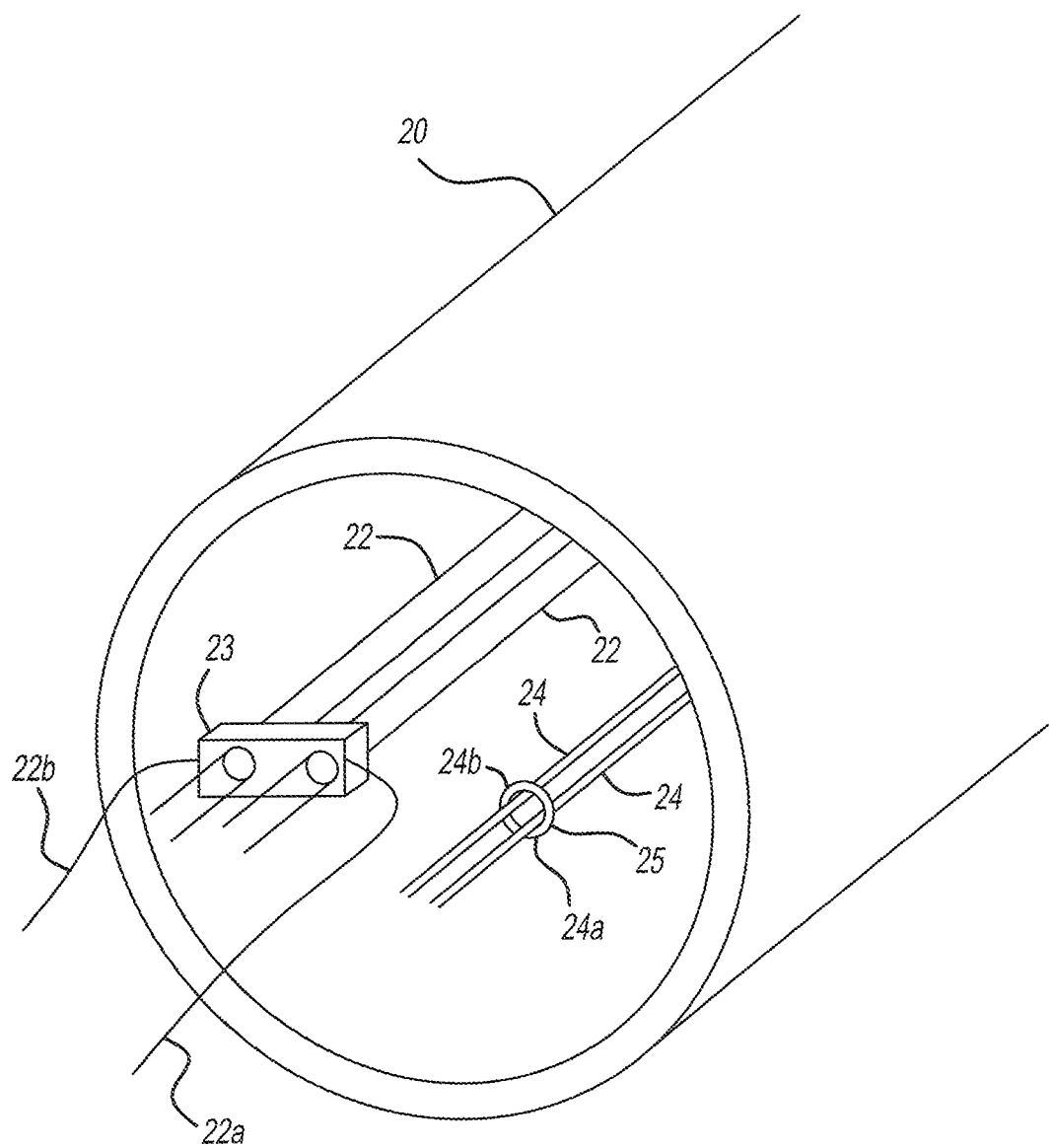
FIG. 9 is an interior view of a boom showing locations of a hydraulic line collector block and a fiber optic conductive clamp.

FIG. 9 is a perspective view of how hydraulic lines 22 and fiber optic cables 24 may reside within boom 20. Additionally, FIG. 9 shows how electric lines 22a, 22b, 24a, 24b may conduct current directed to meter 10 as part of the monitoring of leakage current. Collector 23, which may be a block as illustrated, is electrically conductive and may be the transition point at which hydraulic lines 22 transition from their needing to be insulating part to not needing to be an electrically insulating part. FIG. 9 also depicts fiber optic cables 24, which may be gathered with an electrically conductive clamp 25 from which electric lines 24a, 24b transmit current to meter 10. Electrically conductive clamp 25 has dual electric lines 24a, 24b running from it for the same reason that collector 23 has dual electric lines 22a, 22b running from it, which is to easily permit an electrical continuity test from meter 10 (e.g. as another FIG. 1 function button 46) to ensure there are no breaks or interruptions in the electrical continuity of such an electrical circuit.

During one example operation of the present invention, and with initial reference to FIG. 3, when bucket 56 of aerial lift device 54 is electrically bonded to energized DC power line 62, with bonding clamp 65, also a conductive lead, contacting each of energized DC power line 62 and bucket 56, bucket 56 and any human occupants will reach the same potential or voltage as energized DC power line 62. With such an energized arrangement, DC current passing through boom 20, DC current passing through hydraulic lines 22, and DC current passing through fiber optic cables 24, which individually and collectively are referred to as "leakage current" must be monitored as it moves through these structures to ground 50. Current meter 10 will monitor this DC leakage current, as depicted in FIG. 5. FIG. 5, which is an example graph of DC current in microamps versus microseconds, shows leakage current measurements within a specific DC voltage class. DC current measurements may be taken or measured at almost any frequency, such as from 10 measurements per second to 1000 or more measurements per second, and as previously stated, within a particular DC voltage class for a particular energized DC power line 62. All current measurements may be performed by microcontroller 18, or an average current calculated after a predetermined number of measurements, such as after 100 or 1000, or some other quantity, and then stored in a memory such as external memory 44. An average of some quantity of the current measurements may be displayed on graphical display 42, which may be a color display, and on an LCD display 40, which may be a numerical display. Because over time, electrical charge may build on insulating components such as boom 20, hydraulic lines 22 and fiber optic cables 24, and as a result, an average current value for the total of current measurements, or some predetermined quantity of current measurement values, may increase from a first or safe current zone 116 to current zone 118, which may be a caution zone. In caution zone 118, some current measurement values, such as current measurement value 120 are greater than others, such as current measurement value 122. Zone 124 of FIG. 5 depicts a zone of highest current measurement values, which are also known as current spikes and may indicate an instance of, or impending, flash-over. A flashover is an event in which the DC leakage current exceeds the highest permissible value for a particular voltage class.

With continued reference to FIG. 5, zone 124 represents an impermissible zone within which if DC leakage current reaches for a particular voltage class or range, some intervention or preventive steps need to be taken to stop or reduce the amount of leakage current passing to ground 50. Within impermissible zone 124, microamp levels for current measurements 126, 128 and 130 represent the highest levels of leakage current.

A graph such as the graph depicted with FIG. 5, could be plotted for many different pieces of insulating equipment for which leakage current needs to be monitored. For example, as depicted in FIG. 6, the leakage current passing through insulating ladder 70 could be monitored and plotted for a selected voltage class of an energized DC power line 62 if insulating ladder 70 is in contact with energized DC power line 62. Similarly, as depicted in FIG. 7, the leakage current passing through insulating scaffolding could be monitored and plotted for a selected voltage class of an energized DC power line 62 with which insulating scaffolding 82 is in contact.

Alternatively, an array of information could be compiled and stored, such as in a database in memory 44 of meter 10. An array of information may include columns of information including, but not limited to, time (e.g. seconds), amperage reading (e.g. micro amps) at a time interval (e.g. every 1/60 of a second, every 1/100 of a second, every 1/120th of a second), and average amperage value for a predetermined number of amperage readings (e.g. every 60 reading, every 100 readings), or over a predetermined time period (e.g. every second, every ten seconds). As an example, an average amperage value for a predetermined number of amperage readings, or an average amperage value over a predetermined time period may be displayed on LCD display 40 or other display, such as display 42, on meter 10 for visual inspection by viewer or user of meter 10. Still yet, instead of displaying a numerical value on a display, a graphical representation may simultaneously be displayed or instead be displayed. A graphical representation may be a continuously changing bar graph that graphically displays an average amperage value for a predetermined number of amperage readings, or an average amperage value over a predetermined time period.

Before presenting details of a process or routine that meter 10, and more specifically microcontroller 18 within meter 10, may employ in accordance with the present teachings, further details on measurement by meter 10 of direct current will be presented. When a fully insulating body is exposed to a voltage source (e.g. either AC or DC) no current will pass through it regardless of the voltage or potential difference experienced by the insulating body. However, in reality a fully insulating body or "perfect insulator" does not exist, and all insulators to some degree respond or perform as resistors and therefore are subject to Ohms law for current passing through the insulating body. This is known as resistive current. Thus, in the present teachings, resistive current is passing through the insulating body, such as insulating boom 20, insulating ladder 70, hot sticks 92, 94, etc. to which meter 10 is connected. In addition to resistive current passing through such insulating bodies, another type of current passes through the insulating bodies. This current is known as capacitive current.

A capacitor in its simplest form is essentially two conductive objects separated by an electrically insulating medium. When DC voltage is applied to one of the conductive objects no current will flow from one object to the other, if the insulating medium is perfectly insulating. Regarding AC voltage (time varying voltage), when voltage is applied to the same capacitor, a displacement current passes through the non-perfectly insulating medium. This "capacitive" effect actually occurs when DC voltage is applied as well and is known as a transient voltage and is a result of the lack of a perfect insulator between the conductive objects and the presence of charge carriers in same. Current, known as momentary current, will flow for a short period of time and then stop as the electrical charge between the energized source and the insulating medium reach parity. However this electrical charge is released when this current flows to ground and the cycle repeats. Comparing the preceding explanation to teachings of the present disclosure, a boom 20 of a bucket truck, or other live line tool such as an insulating ladder 70 is an electrically insulating medium. Conductive objects may be DC power line 62 and ground 50, such as Earth.

With reference to FIG. 3, when bucket 56 is electrically bonded (i.e. at the same electrical potential) to DC power line 62, boom 20, because it is physically connected to bucket 56, will still experience a very small current flow to ground 50. The current flow is the sum of the capacitive and resistive currents explained above. The sum of these two types of current is greater with insulating devices, such as boom 20, used in conjunction with AC voltage/AC current power lines than with DC voltage/DC current power lines. Moreover, measuring DC current, such as with meter 10, is different than measuring AC current, especially when DC voltages are high, so as to for example range from 70 kV to 500 KV, which may be measured with teachings of the present disclosure as discussed below. As discovered during testing in conjunction with the present teachings, in direct current situations as the electrical resistance of some insulating materials of insulators begins to degrade or lose their insulating properties, either from contamination or when the voltage applied across an insulator increases relative to the resistance of the insulator, the resistive current will remain relatively unchanged. However, during this time of relatively consistent resistive current, "pulses" or "momentary current spikes" or "short duration spikes," which are increases of capacitive current, which may be many orders of magnitude greater than the relatively stable resistive current, will begin to move through the insulator with increasing intensity and frequency as the resistive threshold (i.e. breakdown) of the insulator is approached. These "pulses" of current may last for only a few milliseconds as they discharge to ground and therefore must be measured in small time intervals by equipment sensitive enough to detect and monitor any pulses. Traditional analog meters or any presently known current measuring devices that display measured current are insufficient at least because an analog needle will not react quickly enough to notify one of impending dielectric breakdown, and a digital LCD display will not register the measured current value and display it for a long enough period of time to be of benefit to a user. Regardless, voltages in the DC voltage range from 70 kV to 500 KV are extraordinarily high for known meters and proper notification of a dielectric failure.

Thus, teachings of the present disclosure may employ an analog to digital converter 16 or other device within meter 10 that is capable of detecting short-lasting current changes for a predetermined number of times in a minute, detecting what that current is, detecting how long each current change or increase lasts, recording them, and displaying such information so that a user can understand what stresses or potential dielectric breakdown a particular insulator is experiencing. The time scale or number of times that a current measurement may be measured may be in the range of 100ths of a second (milliseconds) to 1000ths of a second (microseconds). Durations of an electrical pulse may be in the range from approximately 1/10th of a second to approximately 1/60th of a second. Each current measurement may be in 100ths of an amp (milliamps) to 1000ths of an amp (micro amps), or larger or smaller. In accordance with the present teachings, each current measurement is displayed graphically to allow a user, such as an electrical worker or lineman, to interpret a current measurement, but such measurements are also recorded by the method or process of software within meter 10 by a memory 44, such as a hard drive or similar data memory device. The measurements of current and their duration may be stored in memory 44 of the meter 10 as a series of integers (or values) over a given time period. As measurements of current are recorded by an analog current sensor within ADC 16 and digitally converted, a process or method of software analyzes the current value or reading of the electrical pulses and tracks both, the frequency and intensity. The frequency may be the number of current spikes for a given period of time, and the intensity may be the amplitude or current value. These values are logged (e.g. stored) by the software. The time scale of the frequency of the pulses is not displayed to the worker but is tracked by the software. The worker is only shown the amplitude (the electrical current value) of the pulses. For a voltage of a DC power line 62 applied to a given insulator (e.g. boom 20 of bucket truck, ladder 70, or other live line tool) a known, safe threshold value has been determined through experimentation.

Continuing with FIG. 2, various zones are evident on graphical display 42 to display current values. For example, a safe (e.g. green) level of current is graphically displayed by a series of green bars on the meter with a given value. Such a green zone is predetermined by the DC voltage class (e.g. a DC voltage range) of DC power line 62. Thus, safe zones of measured current by meter 10 will vary based upon the DC voltage range or precise DC voltage of a power line to which meter 10 is connected for measuring current values "leaking" through insulating tools. Thus, any current values or pulses below a predetermined value are shown graphically with green bars on a lighted vertical intensity graph. This could also be displayed through colored lights, a physical graph, or any other graphical display of intensity. Yellow zone (i.e. caution) or red zone (i.e. danger and stop working on DC power line 62) current threshold values are also displayed, but these may be accompanied by an audible or visual warning signal of some type to alert the operator to the presence of increasing intensity of these current pulses. Yellow zone current pulses are of value because changes in the physical positioning of the bucket, insulating properties or momentary voltage increases on DC power line 62 may cause transient current spikes to be measured by meter 10. These must be noted and a user or worker must be alerted to yellow zone current pulses but they do not necessarily constitute a dangerous situation. Red zone current pulses indicate that a safe current threshold of the insulation integrity has been exceeded or is imminent and any workers must remove themselves or the live line tool (e.g. boom 20) from the energized source, such as DC power line 62. Any red zone current pulses would be several orders of magnitude below the actual flashover threshold of the insulating live line tool (e.g. boom 20) to provide additional warning time and an adequate safety factor. A flashover is a dielectric failure of a device such as an insulating live line tool (e.g. boom 20) that can also be thought of as the creation of an instantaneous conductive path for discharge of current, or electrons, through the insulated device.

Because of the relatively large quantities of data the software will generate, in the form of current measurements or calculations, any "old" recorded and displayed current spikes may be constantly deleted from the memory in order to provide the user or worker with newer, more relevant data as to the present or instantaneous insulating properties or condition of an insulating live line tool (e.g. boom 20, hot sticks 92, 94). As an example, a timescale of one minute may be used such that the software would count the current spikes for a given value of time, say 100 recorded current values per second, or 6,000 per minute. As the meter continues operation for however many minutes or hours the meter is employed for a given time of monitoring current, the oldest values of current measured or recorded may be deleted and the graphical display may be reset to show the corresponding lack of incidents, in the current time scale.

As an example, at time 1, which may be a first measurement of a current through a boom 20 or other live line tool, a yellow zone current measurement was recorded and displayed on the graphical display. Subsequently, the next 6,000 instances of current measurements through the boom 20 or other live line tool, no other yellow zone current spikes are measured. As a result, the software may be written to delete the 6000 measurements, and the measurement at time 1, from memory 44. Moreover, the corresponding graphical representation on graphical display 42 of this current spike may be removed. If results are being displayed on LCD display 40 in a continuous fashion, such display on LCD display 40 may be removed. With memory deleted, the process may begin again. Memory 44 may be used to plot graphs of current measurements over time for specific DC voltages and each of the variety of insulating devices with which meter 10 will be used. Alternatively, no memory may be utilized, and one or more of graphical display 42, LCD display 40, and an audible alarm for a yellow zone or red zone event may be utilized.

Figure 10:
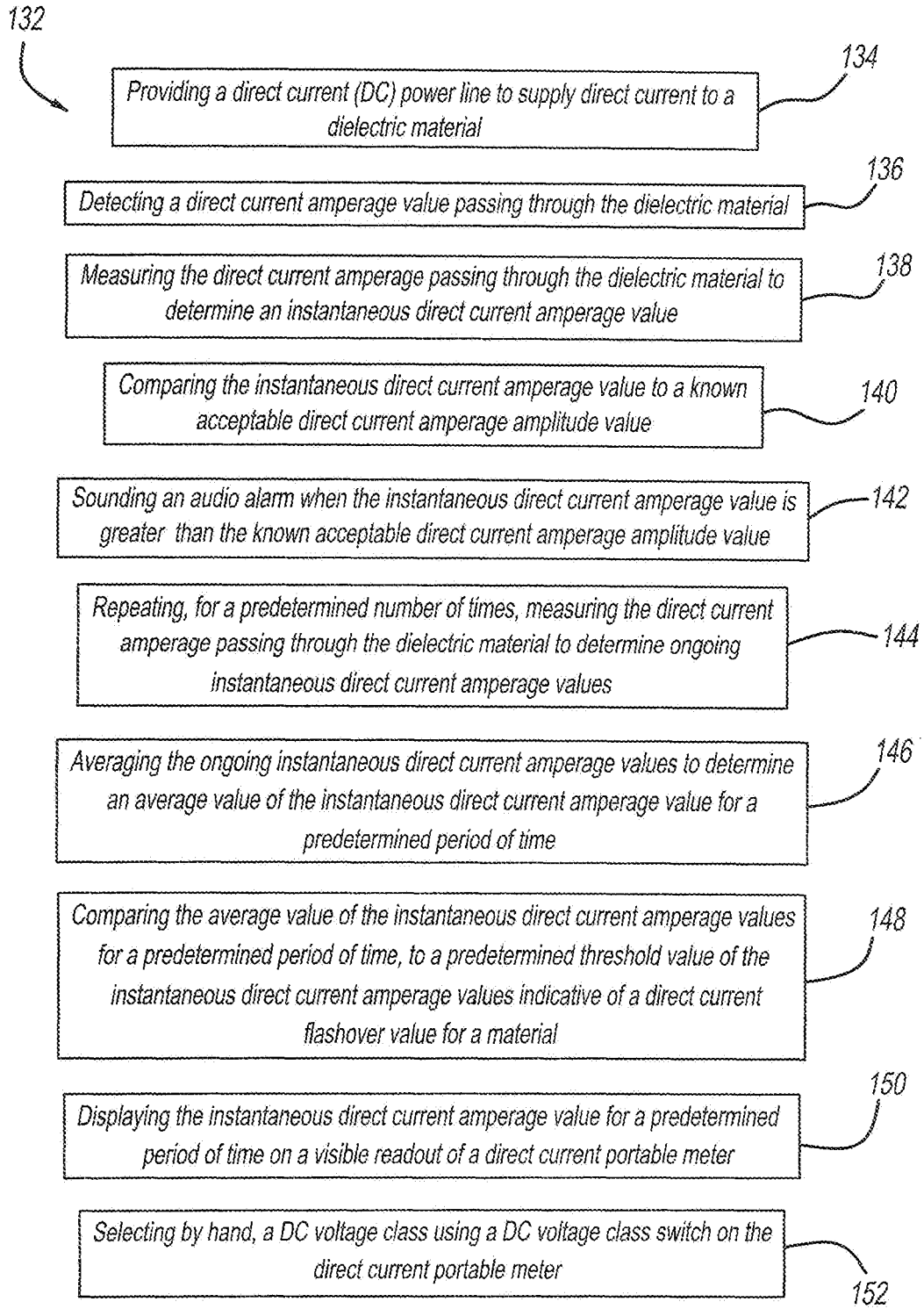
FIG. 10 is a flowchart of a routine controlled by software within microcontroller to monitor current through an insulating body, in accordance with teachings of the present disclosure.

FIG. 10 depicts a flowchart 132 of an example routine controlled by software within microcontroller 18, for example, to monitor current through an insulating body such as boom 20, hot stick 92, 94, or ladder 70, as examples, using meter 10 in accordance with the present teachings. What is being monitored by the routine of flowchart 132 is the flow of current, such as capacitive current. At step 134, the routine may include providing a direct current (DC) power line to supply direct current to a dielectric material. At step 136, the routine may include detecting a direct current amperage value passing through the dielectric material. At step 138, the routine may include measuring the direct current amperage passing through the dielectric material to determine an instantaneous direct current amperage value. At step 140, the routine may include comparing the instantaneous direct current amperage value to a known acceptable direct current amperage amplitude value. At step 142, the routine may include sounding an audio alarm when the instantaneous direct current amperage value is greater than the known acceptable direct current amperage amplitude value. At step 144, the routine may include repeating, for a predetermined number of times, measuring the direct current amperage passing through the dielectric material to determine ongoing instantaneous direct current amperage values. At step 146, the routine may include averaging the ongoing instantaneous direct current amperage values to determine an average value of the instantaneous direct current amperage value for a predetermined period of time. At step 148, the routine may include comparing the average value of the instantaneous direct current amperage values for a predetermined period of time, to a predetermined threshold value of the instantaneous direct current amperage values indicative of a direct current flashover value for the material. At step 150, the routine may include displaying the instantaneous direct current amperage value for a predetermined period of time on a visible readout of a direct current portable meter. At step 152, the routine may include selecting by hand, a DC voltage class using a DC voltage class switch on the direct current portable meter. Additional steps of the routine of flowchart 132 are envisioned, including intervening steps of those steps depicted in FIG. 10.

Figure 11:
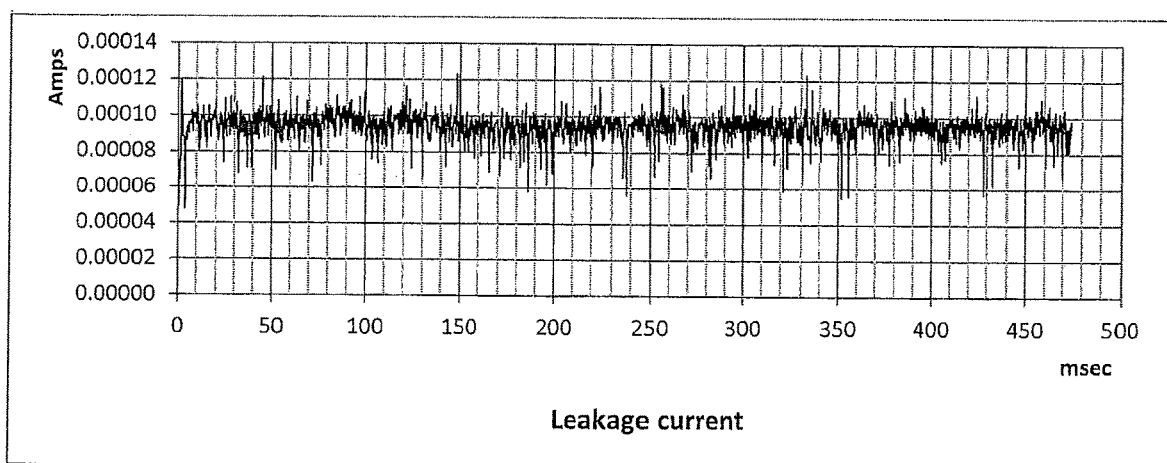
FIG. 11 is a representative waveform of a composite DC current flowing through an insulating structure in a HVDC system.

As explained in the Background above, Applicant has observed that DC current leaking through insulating structures in HVDC systems is in the form of a composite DC current containing one or more high magnitude "short duration" or "momentary" or "very narrow" random spikes. A waveform representative of the composite DC current flowing through such insulating structures is illustrated in FIG. 11. Examples of insulating structures include, but are not limited to, outdoor insulators, aerial booms, insulating scaffolding, insulating hot sticks, hydraulic lines, fiber optic cables or any other structure which may be designed and known to be an insulating structure to the extent its material permits it to be dielectric, insulating or insulative.

Figure 12:
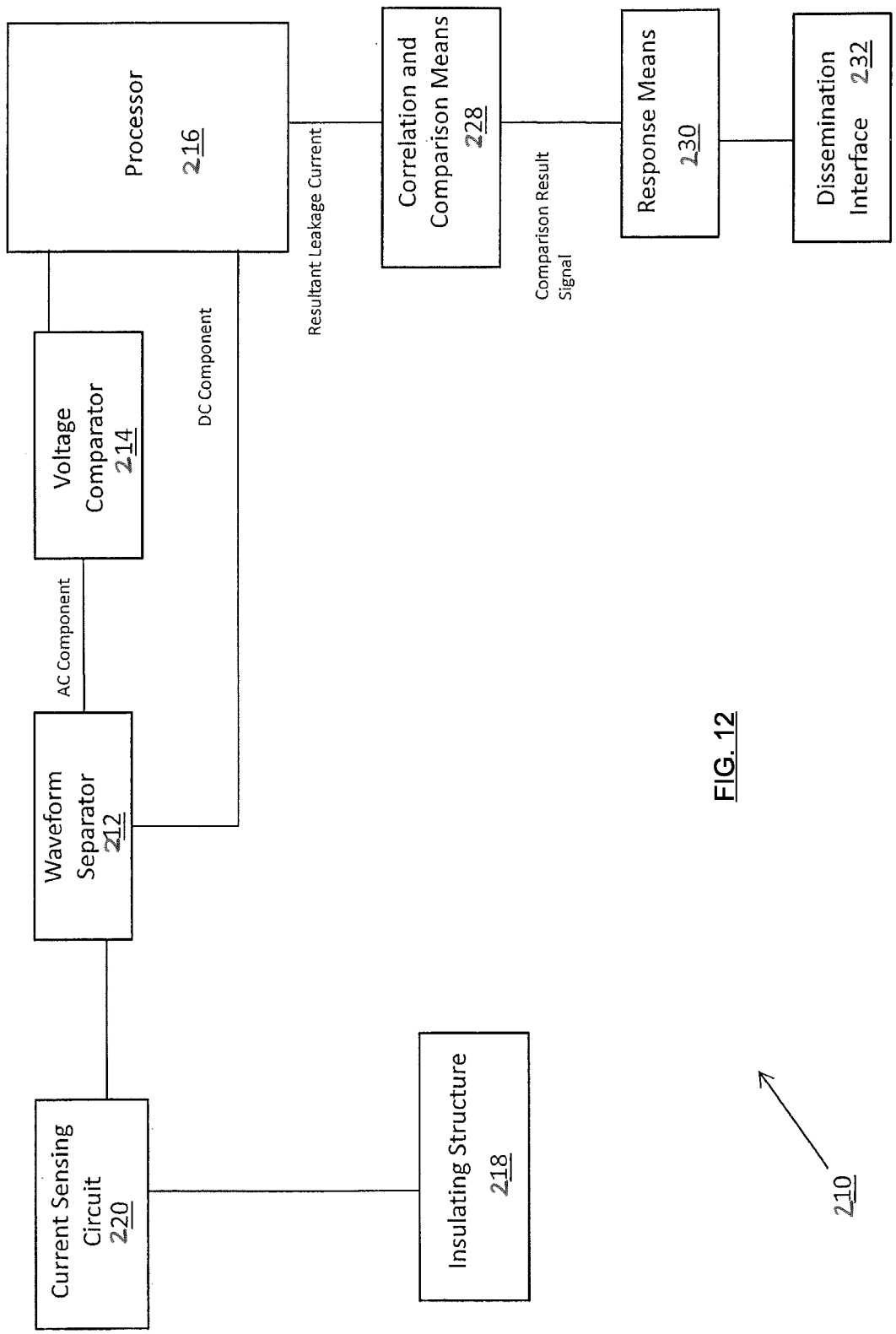
FIG. 12 is a block diagram illustrating one embodiment of an apparatus for measuring leakage current flowing through an insulating structure in a high voltage direct current (HVDC) power system.
Figure 13:
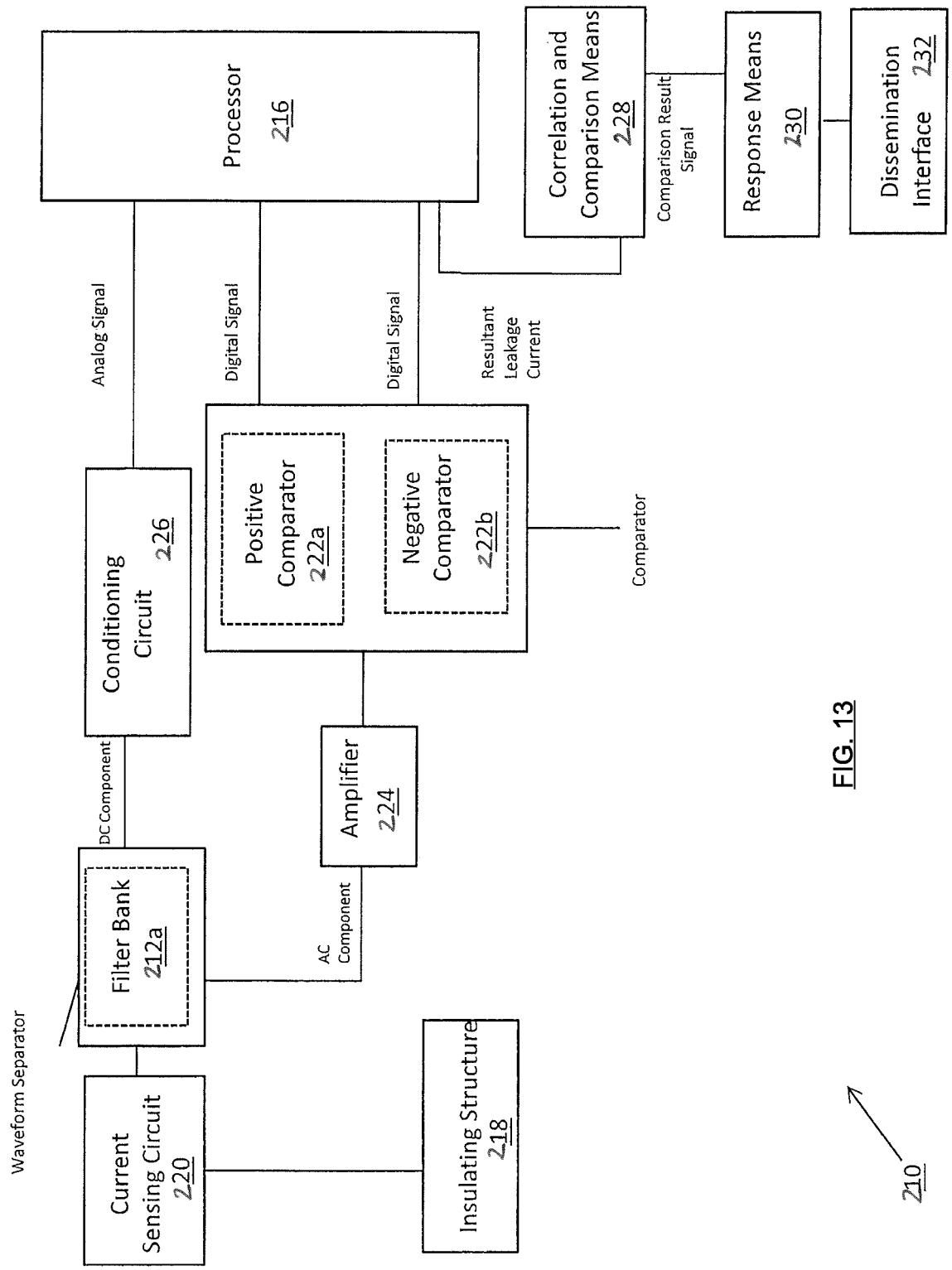
FIG. 13 is a block diagram illustrating further details of the apparatus of FIG. 11.

With reference to FIGS. 12 and 13, apparatus 210 comprises a waveform separator 212, at least one voltage comparator 214 and a processor 216. The waveform separator 212 is configured to receive the composite DC current flowing through an insulating structure 218 in a HVDC system. In one embodiment and with reference to FIGS. 12 and 13, a current sensing circuit 220 may be used to measure the composite DC current leaking through the insulating structure 218. The current sensing circuit 220 is operatively coupled to the insulating structure 218 and the waveform separator 212. Examples of the current sensing circuit 220 include, and are not limited to one or more high precision shunts or shunt resistors (not shown) which receive the composite DC current and output a voltage corresponding to the received composite DC current. The one or more shunt resistors may be associated with one or more amplifiers which amplify the voltage across the one or more shunt resistors to a level that enables further processing by the waveform separator 212.

Current measurements may be taken or measured at almost any frequency, such as from ten measurements per second to one thousand or more measurements per second.

As will be explained in detail in the following paragraphs, the insulating structure 218 may comprise a single insulating structure or multiple insulating structures. In the case of multiple insulating structures, in one embodiment, an electrical collection point may be established and composite DC current leaking through the electrical collection point may be sensed for conduction to the waveform separator 212 for further processing.

Figure 14A:
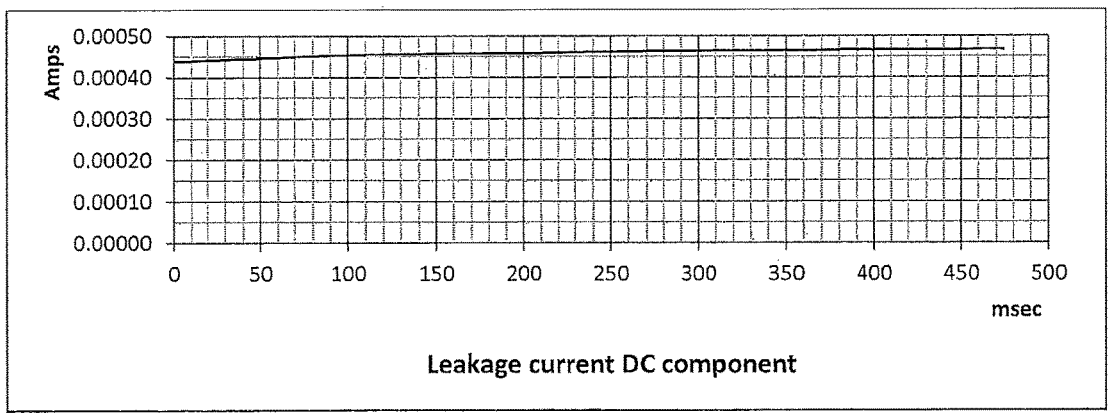
FIGS. 14a and 14b are representative waveforms of the DC and AC components of a composite DC current leaking through the insulating structure and being processed by the apparatus of FIGS. 12 and 13, FIG. 14a diagrammatically representing the nature of the DC component of the composite DC current and FIG. 14b diagrammatically representing the nature of the AC component of the composite DC current.
Figure 14B:
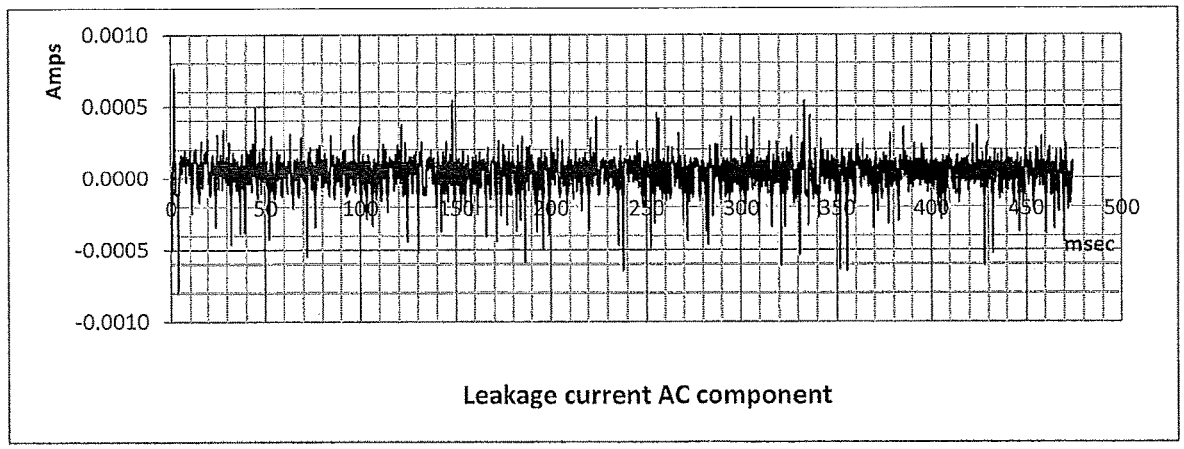

FIGS. 14*a* and 14*b* diagrammatically represent the nature of the DC component and the AC component of the composite DC current, respectively. The AC component may be described as having a first rate of change and the DC component may be described as having a second rate of change. The rate of change of the AC and DC components depends on a multitude of factors including voltage class of the DC power line, dielectric properties of the insulating structure or dielectric contamination of the insulating structure. However, in most cases, the rate of change of the AC component (the first rate of change) is greater and usually significantly greater, than the rate of change of the DC component (the second rate of change). The DC component is usually steady or substantially steady and thus does not substantially change during the measurement process. In other words, the rate of change of the DC component, namely, the second rate of change, is very low. As seen in FIG. 14*b*, the AC component rapidly ramps up and down and hence the AC component has been described herein as fast-moving or fast-changing. On the other hand, the DC component does not change as fast as the AC component or changes at a slow rate as seen in FIG. 14*a*. Therefore, the DC component has been described as slow-moving or slow-changing.

The waveform separator 212 separates the sensed composite DC current into its slow-changing or slow-moving DC component and fast-changing or fast-moving AC component. FIGS. 14*a* and 14*b* illustrate the nature of the DC and AC components respectively. The AC component may have a waveform which is sinusoidal, rectangular, triangular or the like. In one embodiment, the waveform separator 212 comprises one or more high pass and low pass filters forming a filter bank. High pass and low pass filters are of known construction. The filter bank is collectively indicated by reference numeral 212*a* in FIG. 13.

Figure 15A:
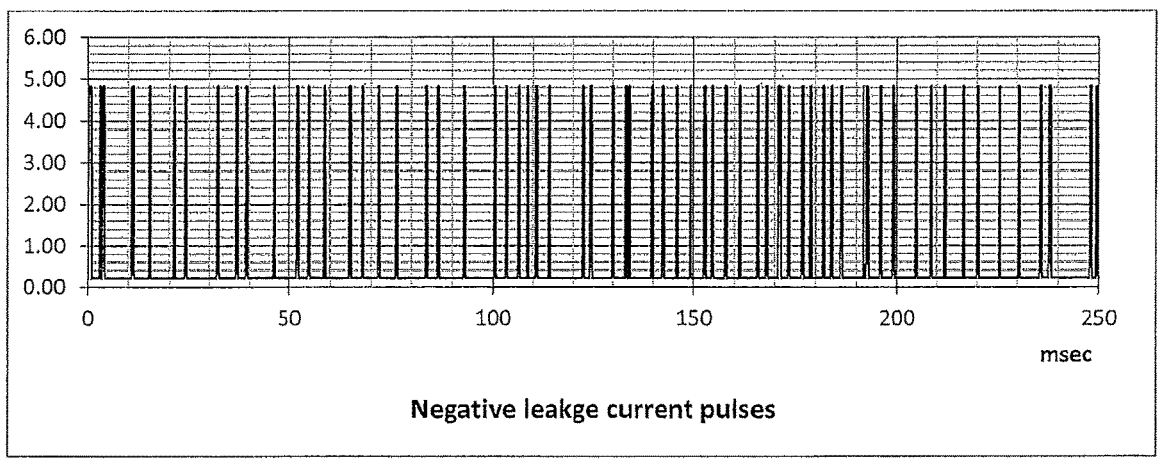
FIGS. 15a and 15b are representative waveforms of the negative and positive pulses of the AC component of FIG. 14b, FIG. 15a representing the negative pulses and FIG. 15b representing the positive pulses.
Figure 15B:
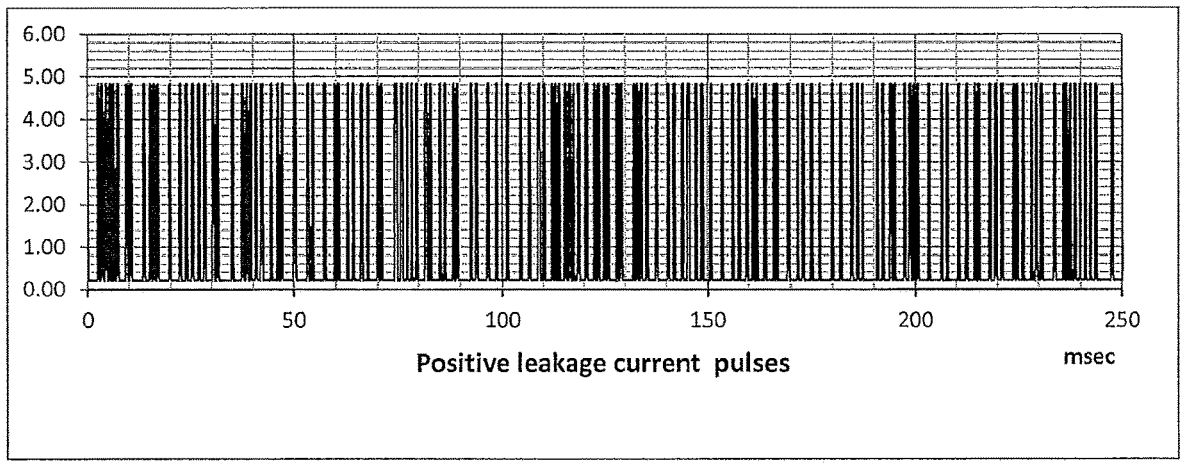

The AC component is received by the at least one voltage comparator 214 that provides a digital signal corresponding to the received AC component. The AC component typically comprises negative and positive components. FIGS. 15*a* and 15*b* illustrate the nature of the negative and positive components contained in the AC component of the composite DC current. Accordingly, in a preferred embodiment, the apparatus 210 comprises two voltage comparators, a positive voltage comparator 222*a* and a negative voltage comparator 222*b* (FIG. 13). The positive voltage comparator 222*a* generates a digital signal representative of the positive AC components. The negative voltage comparator 222*b* generates a digital signal representative of the negative AC components.

In one embodiment, before the AC component is fed to the positive and negative voltage comparators 222*a* and 222*b* they may be conditioned. Conditioning may include amplification of the AC component. In a preferred embodiment and as seen in FIG. 13, the apparatus comprises an amplifier 224 for amplifying the AC component.

The DC component may also be conditioned before it is received by the processor 216. Conditioning may include filtering, amplification or averaging or any combination thereof. The various components of such conditioning circuits are well-known and such circuits are collectively indicated by reference numeral 226 in FIGS. 12 and 13.

The processor 216 receives the DC component and the digital signals representative of the positive and negative AC components for further processing. Since the output of the conditioning circuit 226 processing the DC components is an analog signal, such analog signal must be digitized before it can be processed by the processor 216. Such digitization is generally carried out using an analog-to-digital converter (ADC). The ADC may be separate or the processor 216 may be equipped with its own built-in ADC.

In one embodiment, the processor 216 receives a digital signal representative of the DC component and the digital signals corresponding to the AC positive and negative components and analyzes these to generate a resultant leakage current value flowing through the insulating structure 218. Resultant leakage current calculation is carried out by the processor 216 using known techniques, for example averaging techniques.

In some embodiments, the apparatus 210 may be used to alert workers of changes in the resultant leakage current and/or if the resultant leakage current is within an impermissible range so that the workers may take immediate preventive actions to save themselves and/or related equipment. Accordingly, in some embodiments, the apparatus 210 further comprises a correlation and comparison means 228 for determining a correlation component or parameter value from the resultant leakage current. Herein, the terms "correlation component" and "parameter value" are used interchangeably. In a preferred embodiment, the correlation component is a peak leakage value or RMS value of the resultant leakage current. The correlation component may be any predetermined quantity of the monitored and processed composite DC current, the resultant leakage current. The peak leakage current value may then be compared against a threshold to generate a comparison result signal. The threshold may be representative of fault conditions such as an impending flashover condition. The threshold may be historic values or values derived through experimentation. The comparison result signal may be received by a response means 230 for dissemination of the comparison result signal in one or more forms or a combination of one or more forms. In order to do so, the response means 230 may be associated with one or more dissemination interfaces 232. The comparison signal may be disseminated in a visual or audio or vibratory form or any combination of such forms, or, for example, other forms of haptic, tactile or sensory feedback. The dissemination interface 232 may be any known interface capable of disseminating data, either locally or remotely, or both.

The correlation and comparison means 228 and response means 230 may be modules of the processor 216, such as on the same integrated circuit device, or they may for example be closely coupled auxiliary circuits or chips.

For ease of portability, in one embodiment most components of the apparatus of FIGS. 12 and 13 are located within a casing or housing 234 (FIG. 16) that is configured to be coupled to the insulating structure 218. The processor 216 and memory accessible to the processor providing current measurement and processing described herein may be provided in the housing 234, or such processor may be external to the housing 234 and coupled to the housing 234 for back and forth data communication. The processor 216 may be part of a computer system, or other microprocessor-based system. Although one processor is described, multiple processors may be provided and programmed to enable the leakage current measurement and processing herein, and such processors may be present in the housing 234 with the one or more other components of the apparatus 210, or the computer system, or both.

The one or more interfaces 232 for disseminating the comparison result signal may be arranged or positioned within and around a surface of the housing 234.

Figure 16:
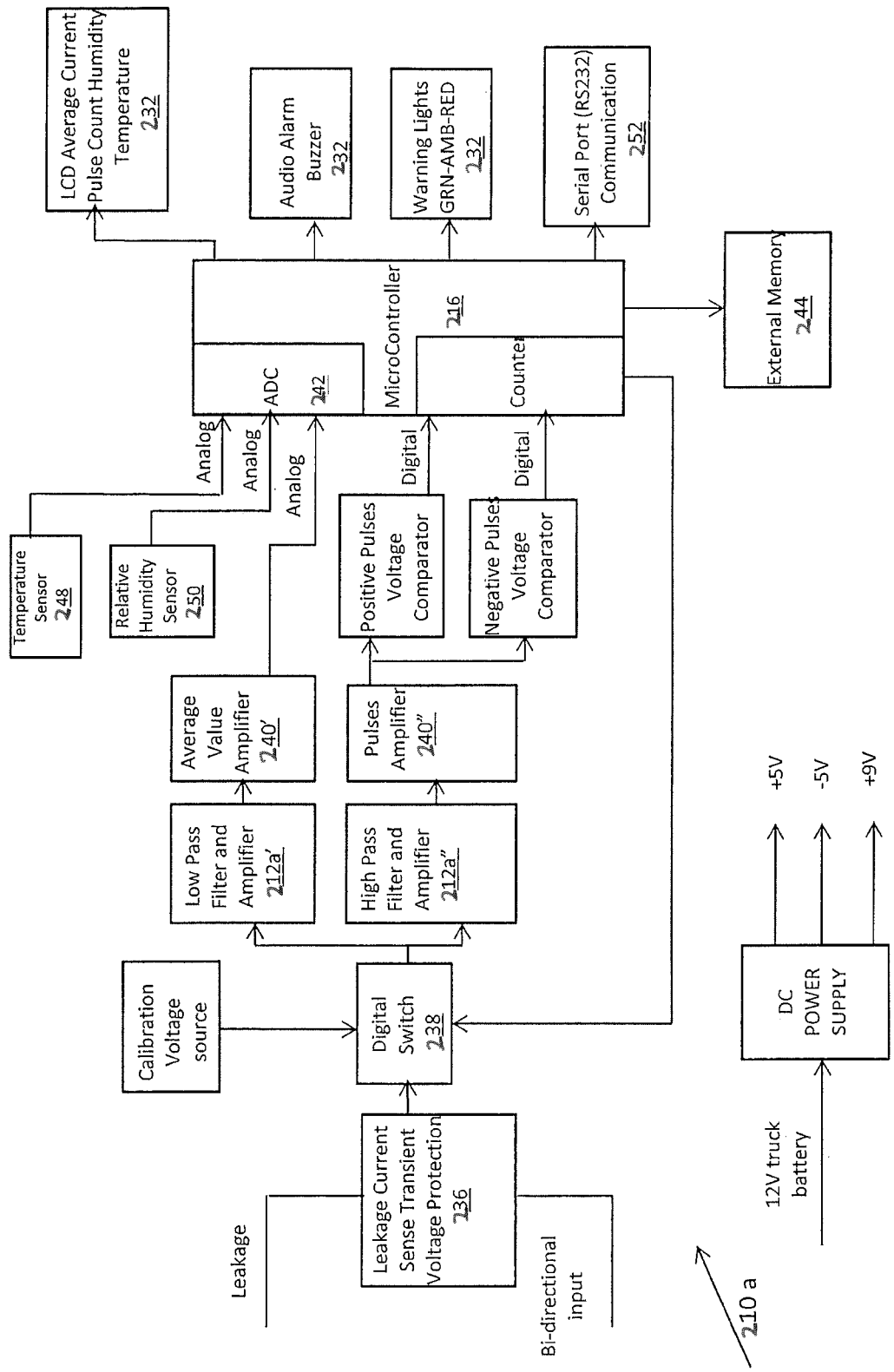
FIG. 16 is a block diagram of an embodiment of the apparatus of FIGS. 12 and 13.

FIG. 16 is a block diagram of one embodiment showing operative components of a proposed embodiment 210a of the apparatus 210. The embodiment 210a includes the operative components illustrated in FIGS. 12 and 13, and such corresponding operative components are designated by the same reference numerals as in FIGS. 12 and 13. Most operative components of the embodiment 210a are located in a casing such as housing 34. Composite DC current leaking through an insulating structure flows into the apparatus 210 through a transient voltage protector device 236 which protects all electrical downstream components from a power surge. The embodiment 210a further comprises a switch 238 for changing the processor 216 from its normal or "run" setting to its calibration setting and vice versa. The filter bank 212a of the waveform separator 212 includes a low pass filter 212a' and a high pass filter 212". The low pass and high pass filters are associated with corresponding amplifiers, 240' and 240". The DC component is filtered out by the low pass filter 240' and the AC component is filtered out by the high pass filter 240". Outputs of the two filters are amplified prior to further processing. The output of amplifier 240" is fed to positive and negative voltage comparators, 222a and 222b, which in turn generate digital signals corresponding to the positive and negative components contained in the AC part of the composite DC current. The output of amplifier 240' (amplified DC component) is an analog signal. The digital signals corresponding to the AC component and the analog signal corresponding to the DC component are received by the processor 216 for further processing. The processor 216 of the embodiment 210a has an in-built ADC 242 which receives the analog signal corresponding to the DC component and digitizes the same. The input signals are processed by the processor 216 to determine a resultant leakage current using methodologies well known in the art. The processor 216 of the embodiment 210a is associated with an external memory 244 for storing information relating to the resultant leakage current and/or its associated components. The embodiment 210a also comprises one or more dissemination interfaces arranged around an external surface of the housing 234. The dissemination interfaces 232 associated with the prototype include an audio speaker and LCD displays. As stated above, the interfaces may be used to alert a worker of changes in resultant leakage current flowing through the insulating structure 218. In the embodiment of FIG. 16, the processor 216 also receives input from a temperature sensor 248 and a humidity sensor 250 located in the vicinity of the insulating structure for sensing the temperature and humidity of the air around the insulating structure. Input received from the temperature and humidity sensors may also be displayed on or more of the dissemination interfaces 232. The processor 216 includes a serial port to communicate with the peripherals such as the dissemination interfaces 232 and/or input device(s).

As will be understood, meter 10, such as described above, may be used in conjunction with, or may contain apparatus 210 for measuring leakage current flowing through various forms of insulating structures, such as those illustrated in FIGS. 3, 4, and 6-9 and described above. The operative components of the apparatus 210 may thus be housed within the casing 52. The apparatus 210 is generally connected in series between an insulating member, for example a boom, hot stick(s), ladder, scaffolding, and ground G in order to measure and process the composite DC current flowing through the insulating structure. As stated above, in some embodiments, the apparatus 210 may be used for real-time monitoring of current leaking through one or more insulating structures which are electrically coupled to a high voltage DC energized conductor.

As stated above, current measurements may be taken or measured at almost any frequency. An average or resultant leakage current may be calculated after a predetermined number of measurements, such as after one hundred or one thousand, or some other quantity, and then stored in a memory which may internal or external to the apparatus 210. The resultant leakage current or some quantity or component of the measured and processed leakage current (herein referred to as correlation component or parameter value) may be displayed on the one or more interfaces 232 associated with the apparatus 210.

Over time, dielectric performance of insulating structures may deteriorate. Accordingly, resultant leakage current or some predetermined quantity or component thereof, may increase from a first value to a second value. As stated above, the apparatus 210 may be used to monitor and disseminate such trends in leakage current values on a real-time basis so as to alert workers or operators of the increasing intensity of the leakage current flowing through the insulating structures.

In one embodiment, resultant leakage current or any component thereof may be associated with three zones of operation, a safe zone, a caution zone and a danger zone. In the safe zone, the leakage current is within a permissible range. In the caution zone, the resultant leakage current is outside the safe zone but is not within an impermissible range. Caution zone values do not necessarily constitute a dangerous situation. In the danger zone, the resultant leakage current is within the impermissible range. Danger zone is generally indicative of an impending, flashover condition. Danger zone indicates that insulation integrity has been compromised. As one of skill in the art will understand, danger zone limits would be several orders of magnitude below the actual flashover threshold of the insulating live line structure to provide additional warning time and an adequate safety factor for the workers to remove themselves from the insulating structure and/or take steps to stop or reduce the amount of current passing to the ground 250. The threshold for the safe, caution and danger zones for a DC voltage class or range may be derived from historic values representative of fault conditions such as an impending flashover condition for that class. Safe zone limits will vary based upon the DC voltage range or precise DC voltage of a power line to which the apparatus is operably coupled to.

In one embodiment, leakage current values in the safe zone (e.g. green) may be graphically displayed by a series of green bars along with the given value. Leakage current values may be displayed through colored lights, a physical graph, or any other graphical display of intensity. In one embodiment, caution (e.g. yellow) and danger zone (e.g. red) leakage current values are also displayed. However, values in the caution and danger zones may also be accompanied by an audible or visual warning signal of some type to alert the operator to the presence of increasing intensity of the leakage current.

The resultant leakage current values determined by the apparatus described herein may be plotted on a graph. Alternatively, an array of information could be compiled and stored, such as in a database in the memory associated with the apparatus 210. The measurements of current and their duration may be stored in the memory as a series of integers (or values) over a given time period. The database may include columns of information including, but not limited to, time (e.g. seconds or microseconds), amperage reading of the DC composite current (e.g. micro amps) at a time interval (e.g. every $\frac{1}{60}$ of a second, every $\frac{1}{100}$th of a second, every $\frac{1}{120}$th of a second), amperage reading of the resultant leakage current (e.g. micro amps) and average amperage value of the resultant leakage current over a predetermined time period (e.g. every second, every ten seconds). As an example, average amperage value of the resultant leakage current for a predetermined number of readings, or an average amperage value over a predetermined time period may be displayed on the displays associated with the apparatus 210 for visual inspection by viewer or user of the apparatus 210. Still yet, instead of displaying a numerical value on a display, a graphical representation may simultaneously be displayed or instead be displayed. A graphical representation may be a continuously changing bar graph that graphically displays an amperage value of the resultant leakage current.

As described above, in order to optimize usage of the memory, any "old" or past-relevant historical recorded and displayed resultant leakage current values may be deleted from the memory associated with the apparatus in order to provide the user or worker with newer, more relevant data as to the present or instantaneous insulating properties or condition of the insulating structure 218.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A system for detecting leakage current in high voltage direct current power systems having an energized DC electrical line above an Earthen surface comprising:
a substantially electrically insulating structure having a first end adapted to be located proximate to, and electrically connected to, the energized DC electrical line, and a second end adapted to be located towards the Earthen surface;
a direct current meter adapted to be electrically coupled in series between the substantially electrically insulating structure and the Earthen surface, wherein the direct current meter is configured to detect a plurality of momentary leakage current values flowing through the substantially electrically insulating structure when electrically coupled to the direct current meter, and wherein the direct current meter includes a waveform separator system for determining DC leakage current flowing through the substantially electrically insulating structure, wherein the DC leakage current is a composite DC current comprising one or more high magnitude momentary spikes, and having a DC component and an AC component, and wherein the wave-form separator system includes:
a waveform separator configured to receive the composite DC current flowing through the substantially electrically insulating structure and to separate the composite DC current into the DC component and the AC component, wherein the AC component has a first rate of change, and wherein the DC component has a second rate of change, and wherein the first rate of change is greater than the second rate of change;
at least one comparator configured to receive the AC component and produce at least one corresponding AC digital signal; and
a processor configured to: (a) receive the at least one corresponding AC digital signal and the DC component, (b) analyze the at least one corresponding AC digital signal and the DC component, and (c) determine a resultant leakage current flowing through the substantially electrically insulating structure.

2. The system of claim 1 further comprising a current sensing circuit which, when operatively coupled to the substantially electrically insulating structure and the waveform separator, senses the composite DC current flowing through the substantially electrically insulating structure and feeds a voltage value corresponding to the sensed current to the waveform separator.

3. The system of claim 2, wherein the current sensing circuit includes one or more shunts or shunt resistors.

4. The system of claim 2, wherein the waveform separator comprises at least one filter circuit for separating the DC component from the AC component in the sensed composite DC current.

5. The system of claim 1 further comprising at least one amplifier for amplifying the AC component and the DC component.

6. The system of claim 5 further comprising an averaging circuit to average the DC component over time before the DC component is fed to the at least one amplifier.

7. The system of claim 1, wherein the DC component is substantially steady.

8. The system of claim 5, wherein the AC component comprises one or more positive components and one or more negative components and wherein the system further comprises at least one positive voltage comparator for counting the one or more positive components and at least one negative voltage comparator for counting the one or more negative components for producing at least one positive digital signal corresponding to the counted one or more positive components and a negative digital signal corresponding to the counted one or more negative components.

9. The system of claim 1, wherein the processor is further configured to: (a) determine a correlation component from the resultant leakage current, and (b) compare the correlation component against a threshold value and to generate a comparison result signal indicative of a fault if the correlation component exceeds the threshold value.

10. The system of claim 9 further comprising a response means for receiving said comparison result signal and disseminating the comparison result signal through at least one dissemination interface.

11. The system of claim 9, wherein the correlation component is a peak value or RMS value of the resultant leakage current.

12. The system of claim 9, wherein the fault is reduced dielectric performance.

13. The system of claim 9, wherein the fault is an impending flashover condition.

14. The system of claim 10, wherein disseminating the comparison result signal comprises at least one haptic, tactile, or sensory information.

15. The system of claim 10, wherein one or more components of the system are located in a portable housing.

16. The system of claim 15, wherein the at least one dissemination interface is associated with the housing.

17. The system of claim 16, wherein the at least one dissemination interface is a graphical display configured to indicate at least the resultant leakage current.

18. The system of claim 15, wherein the one or more components include a current sensing circuit, the waveform separator, the at least one comparator and the processor.

19. The system of claim 15, wherein the one or more components include a current sensing circuit, the waveform separator and the at least one comparator.

20. The system of claim 19, wherein the housing further includes a communicator to transfer and receive data to and from the processor.

21. The system of claim 1, wherein the DC component is a slow-moving analog component and the AC component is a fast-moving analog component.

* * * * *